(12) United States Patent
Huang et al.

(10) Patent No.: US 12,507,485 B2
(45) Date of Patent: Dec. 23, 2025

(54) BIPOLAR JUNCTION TRANSISTOR WITH LATERAL AND VERTICAL CONDUCTING PATHS

(71) Applicant: AMAZING MICROELECTRONIC CORP., New Taipei (TW)

(72) Inventors: Sung-Chih Huang, Jiaoxi Township (TW); Chih-Ting Yeh, Zhudong Township (TW); Che-Hao Chuang, Jhudong Township (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 448 days.

(21) Appl. No.: 18/209,281

(22) Filed: Jun. 13, 2023

(65) Prior Publication Data
US 2024/0421146 A1    Dec. 19, 2024

(51) Int. Cl.
*H10D 89/60*    (2025.01)
*H10D 10/60*    (2025.01)

(52) U.S. Cl.
CPC ............. *H10D 89/60* (2025.01); *H10D 10/60* (2025.01)

(58) Field of Classification Search
CPC ...... H10D 89/60; H10D 10/60; H10D 89/711; H10D 84/611; H10D 62/10; H10D 62/124; H01L 23/481
See application file for complete search history.

(56) References Cited

U.S. PATENT DOCUMENTS

| | | | | |
|---|---|---|---|---|
| 6,707,110 B2* | 3/2004 | De Heyn | ............... | H10D 10/60 257/361 |
| 8,552,530 B2* | 10/2013 | Lin | ...................... | H10D 89/711 361/111 |
| 2006/0151836 A1* | 7/2006 | Salcedo | ............... | H10D 89/713 257/362 |
| 2011/0021009 A1* | 1/2011 | Marreiro | .................. | H10D 8/25 257/E21.135 |
| 2012/0281329 A1* | 11/2012 | Mallikarjunaswamy | | ..................... H10D 89/713 361/111 |

(Continued)

FOREIGN PATENT DOCUMENTS

| | | |
|---|---|---|
| CN | 105308750 A | 2/2016 |
| CN | 116190375 A | 5/2023 |

(Continued)

*Primary Examiner* — S M Sohel Imtiaz
(74) *Attorney, Agent, or Firm* — Birch, Stewart, Kolasch & Birch, LLP

(57) ABSTRACT

A bipolar junction transistor is provided, including a semiconductor substrate and a doped layer of a first conductivity type, a doped well region of a second conductivity type formed in the doped layer, a first, second heavily doped region of the second conductivity type, and a third, fourth and fifth heavily doped region of the first conductivity type in the doped well region. The fifth heavily doped region is coupled with a first pin. The third and fourth heavily doped regions are coupled with a second pin. A sixth and seventh heavily doped region of the first conductivity type are disposed in the doped layer. The sixth and first heavily doped regions are connected in common. The seventh and second heavily doped regions are connected in common. When applying either a positive or negative surged mode, the bipolar junction transistor is formed, having both lateral and vertical conducting paths.

27 Claims, 21 Drawing Sheets

(56) References Cited

U.S. PATENT DOCUMENTS

| | | | | |
|---|---|---|---|---|
| 2017/0069620 A1* | 3/2017 | Tu | ............................ | H10D 89/60 |
| 2019/0319097 A1* | 10/2019 | Kushner | ............... | H10D 10/061 |
| 2020/0035664 A1* | 1/2020 | Lin | ....................... | H10D 89/713 |
| 2020/0066714 A1* | 2/2020 | Qiao | ....................... | H10D 84/08 |
| 2020/0203333 A1* | 6/2020 | Chen | .................... | H10D 12/032 |

FOREIGN PATENT DOCUMENTS

| | | | |
|---|---|---|---|
| TW | 200841451 | A | 10/2008 |
| TW | M439893 | U1 | 10/2012 |
| TW | 202111912 | A | 3/2021 |
| TW | I736548 | B | 8/2021 |

* cited by examiner

BIPOLAR JUNCTION TRANSISTOR WITH LATERAL AND VERTICAL CONDUCTING PATHS

BACKGROUND OF THE INVENTION

Field of the Invention

The present disclosure is related to a bipolar junction transistor design scheme. And more particularly, it is related to a bipolar junction transistor structure which is characterized by having both lateral and vertical conducting paths, wherein less circuit complexity is required, and circuit layout area consumption can be reduced at the same time.

Description of the Prior Art

As known, a transient voltage suppressor or known as a "TVS" is a general classification of electronic components that are designed to react to sudden or momentary overvoltage conditions. One such common device used for this purpose is known as the transient voltage suppression diode, a Zener diode designed to protect electronics device against over-voltages. In general, the characteristic of a transient voltage suppressor (TVS) requires that it responds to over-voltages faster than other common overvoltage protection components such as varistors or gas discharge tubes. Such characteristic of the TVS device or component makes it much more useful for protection against extremely fast and often damaging voltage spikes, since these fast overvoltage spikes are present on all distribution networks and can be caused by either internal or external events, such as lightning or motor arcing. In addition, applications of the transient voltage suppression devices are able to be used for unidirectional or bidirectional electrostatic discharge (ESD) protection of transmission or data lines in electronic circuits. Usually, the level of the ESD energy in a transient overvoltage can be equated to energy measured in joules or related to electric current when devices are rated for various applications. These bursts of overvoltage can be measured with specialized electronic meters that can show power disturbances of thousands of volts amplitude that last for a few microseconds or less.

An U.S. patent number of U.S. Pat. No. 6,707,110 B2 has disclosed a layout configurable electrostatic discharge device for integrated circuits. Such device is to be provided as an electrostatic discharge device of which its holding voltage can be predetermined, by varying its layout parameter, such that the current dependency of its holding voltage can be reduced. However, it should be noticed that according to such prior art, whereas a bipolar junction transistor (BJT) structure has a pick-up base so that its gain of the transistor will be much more suppressed. Moreover, another U.S. patent number of US 2020/0035664 A1 has disclosed a vertical transient voltage suppression device, which floats the base of a vertical bipolar junction transistor (BJT) thereof in order to maintain a low holding voltage and a low clamping voltage and to enhance its electrostatic discharge performance. However, in such a prior transient voltage suppression device, a diode structure should be employed and arranged in the epitaxial layer and electrically connected through a conductive trace. In addition, since a first pin and a second pin of the prior transient voltage suppression device need to be arranged on opposite surfaces of the transient voltage suppression device, a backside metallization process must be adopted, thereby increase the process steps, fabrication cost and process complexity significantly.

Apart from these, another U.S. patent number of U.S. Pat. No. 8,552,530 B2 has also disclosed a vertical transient voltage suppressor for protecting an electronic device. As known, an object of such prior transient voltage suppressor is to provide a vertical transient voltage suppressor for ESD protection that may adaptively provide effectively ESD protection under positive and negative ESD stresses, decrease its variation in breakdown voltage and generate symmetric I-V characteristic curves and breakdown voltages. Nevertheless, as mentioned before in the previous conventional reference, since a first pin and a second pin of such vertical transient voltage suppressor are also disposed on opposite surfaces of the transient voltage suppressor, the backside metallization process is thus unavoidable as well. Furthermore, due to a vertical NPN bipolar junction transistor structure formed thereof has a greater transistor gain, which on the other hand, reduces its holding voltage. And such result is definitely not what to be expected. In addition, it is also known that in view of such mostly conventional transient voltage suppressor structures, internal circuit component designs will often interfere with each other, and yet becoming much more severe and even less tolerable, and also being very difficult to control accurately.

As a result, based on the foregoing drawbacks and necessary suppression and elimination of the conventional issues are thus to be expected, it, in view of all, should be apparent and obvious that there is indeed an urgent need for the professionals in the field for a novel and inventive transistor structure to be developed, so as to solve the above-mentioned issues occurring in the prior arts. And in particular, the full detailed specific descriptions and implementations are now to be provided by Applicants of the present invention in the following paragraphs as below for your references.

SUMMARY OF THE INVENTION

In order to overcome the above-mentioned disadvantages, one major objective in accordance with the present invention is provided for a novel and creative circuit scheme for providing a bipolar junction transistor structure. And more particularly, the proposed circuit scheme of the disclosed bipolar junction transistor structure is characterized by having both a lateral conducting path and a vertical conducting path, in view of the advantageous of using less circuit complexity and circuit layout area consumption.

Another objective in accordance with the present invention is to provide a novel bipolar junction transistor structure with lateral and vertical conducting paths, in which, when the lateral conducting path is formed, the disclosed bipolar junction transistor structure is a floating base bipolar junction transistor (BJT) structure. Also, when the vertical conducting path is formed, the disclosed bipolar junction transistor structure forms a floating base BJT structure as well. In addition, as compared to the prior arts, the additional lateral conducting path is to be formed, so as to further provide a discharging path in order to release the transient surge, and also to lower the conducting resistivity for the purpose of providing an even better Electro Static Discharge (ESD) performance.

And yet, one more another objective in accordance with the present invention is to provide an inventive bipolar junction transistor with lateral and vertical conducting paths, in which when a positive surged operating mode is applied to the bipolar junction transistor structure, its vertical conducting path to be formed, includes not only a vertical n-p-n bipolar junction transistor structure but also a forward diode connected in series with the vertical n-p-n bipolar junction transistor structure. By employing such circuit design figure, the convention latch-up issue can be effectively avoided. And the layout circuit fabrication process of the present invention is advantageous of having better flexibility. As a result, it is apparent that the process complexity of the present invention is able to be made lowered and easy to be in control.

Therefore, in the following descriptions, the Applicants will proceed to provide a plurality of embodiments and variations that will be discussed later in the following paragraphs in order to verify the proposed bipolar junction transistor with lateral and vertical conducting paths is effective. Thereby, it is worthy of full attentions that the present invention achieves to successfully solve the problems of prior arts and meanwhile maintain superior electrical properties. As a result, it is believed that the proposed technical contents of the present invention are extremely advantageous of as being highly competitive and able to be widely utilized in related IC and semiconductor industries.

Therefore, in order to achieve the above-mentioned objectives, the present invention is aimed to provide a modified bipolar junction transistor with lateral and vertical conducting paths introduced as follows.

According to the present invention, the bipolar junction transistor with lateral and vertical conducting paths includes a semiconductor substrate of a first conductivity type, a doped layer of the first conductivity type, which is formed on the semiconductor substrate, and a doped well region of a second conductivity type, which is formed in the doped layer of the first conductivity type, and the second conductivity type is opposite to the first conductivity type.

A first heavily doped region of the second conductivity type, a second heavily doped region of the second conductivity type, a third heavily doped region of the first conductivity type, a fourth heavily doped region of the first conductivity type and a fifth heavily doped region of the first conductivity type are further disposed in the doped well region of the second conductivity type. And the fifth heavily doped region of the first conductivity type is electrically coupled with a first pin, and the third heavily doped region of the first conductivity type and the fourth heavily doped region of the first conductivity type are electrically connected in common and coupled with a second pin. The first heavily doped region of the second conductivity type and the second heavily doped region of the second conductivity type are spaced apart by the third heavily doped region of the first conductivity type, the fourth heavily doped region of the first conductivity type and the fifth heavily doped region of the first conductivity type.

In addition, a sixth heavily doped region of the first conductivity type and a seventh heavily doped region of the first conductivity type are disposed in the doped layer of the first conductivity type, wherein the sixth heavily doped region of the first conductivity type and the seventh heavily doped region of the first conductivity type are spaced apart by the doped well region of the second conductivity type, and the sixth heavily doped region of the first conductivity type is electrically connected with the first heavily doped region of the second conductivity type, and the seventh heavily doped region of the first conductivity type is electrically connected with the second heavily doped region of the second conductivity type.

According to one preferred embodiment of the present invention, when the first conductivity type is N type and the second conductivity type is P type, the above mentioned first pin and the second pin are electrically coupled to a positive voltage level and a ground voltage level, respectively so as to provide a positive surged operating mode.

In such an embodiment of the present invention, when the positive surged operating mode is applied, the bipolar junction transistor having a lateral conducting path is formed, and the lateral conducting path comprises at least one lateral n-p-n bipolar junction transistor structure. The at least one lateral n-p-n bipolar junction transistor structure is constructed from the fifth heavily doped region of the first conductivity type, the doped well region of the second conductivity type to the third heavily doped region of the first conductivity type, and from the fifth heavily doped region of the first conductivity type, the doped well region of the second conductivity type to the fourth heavily doped region of the first conductivity type.

In addition, when the positive surged operating mode is applied, the bipolar junction transistor having a vertical conducting path may also be formed, and the vertical conducting path comprises at least one vertical n-p-n bipolar junction transistor structure and at least one forward diode connected in series with the vertical n-p-n bipolar junction transistor structure. The at least one vertical n-p-n bipolar junction transistor structure is constructed from the fifth heavily doped region of the first conductivity type, the doped well region of the second conductivity type, the doped layer of the first conductivity type to the sixth heavily doped region of the first conductivity type, and from the fifth heavily doped region of the first conductivity type, the doped well region of the second conductivity type, the doped layer of the first conductivity type to the seventh heavily doped region of the first conductivity type. And the at least one forward diode is constructed from the sixth heavily doped region of the first conductivity type, the first heavily doped region of the second conductivity type, the doped well region of the second conductivity type to the third heavily doped region of the first conductivity type, and from the seventh heavily doped region of the first conductivity type, the second heavily doped region of the second conductivity type, the doped well region of the second conductivity type to the fourth heavily doped region of the first conductivity type.

On the other hand, according to the alternative embodiment of the present invention, when the first conductivity type is N type and the second conductivity type is P type, the above mentioned first pin and the second pin may also be electrically coupled to a negative voltage level and a ground voltage level, respectively so as to provide a negative surged operating mode.

According to the alternative embodiment, when the negative surged operating mode is applied, the bipolar junction transistor having a lateral conducting path is formed, and the lateral conducting path comprises at least one lateral n-p-n bipolar junction transistor structure. The at least one lateral n-p-n bipolar junction transistor structure is constructed from the third heavily doped region of the first conductivity type, the doped well region of the second conductivity type to the fifth heavily doped region of the first conductivity type, and from the fourth heavily doped region of the first conductivity type, the doped well region of the second conductivity type to the fifth heavily doped region of the first conductivity type.

Furthermore, according to one another alternative embodiment of the present invention, the disclosed bipolar junction transistor may further include an eighth heavily doped region of the second conductivity type and a ninth heavily doped region of the second conductivity type, which are disposed in the doped layer of the first conductivity type.

And the eighth heavily doped region of the second conductivity type, the ninth heavily doped region of the second conductivity type, the third heavily doped region of the first conductivity type, and the fourth heavily doped region of the first conductivity type are electrically connected in common and coupled with the second pin. According to such an embodiment, when the first conductivity type is N type and the second conductivity type is P type, the first pin and the second pin can be electrically coupled to a positive voltage level and a ground voltage level, respectively so as to provide a positive surged operating mode. At this time, the bipolar junction transistor having a lateral conducting path, which includes at least one lateral n-p-n bipolar junction transistor structure is formed. Moreover, when the positive surged operating mode is applied, the bipolar junction transistor having a vertical conducting path is formed, and the vertical conducting path comprises at least one vertical n-p-n bipolar junction transistor structure and at least one forward diode connected in series with the vertical n-p-n bipolar junction transistor structure.

On the other hand, in such a variant embodiment, wherein the eighth heavily doped region of the second conductivity type and the ninth heavily doped region of the second conductivity type are further disposed, when the first conductivity type is N type and the second conductivity type is P type, the first pin and the second pin may also be electrically coupled to a negative voltage level and a ground voltage level, respectively so as to provide a negative surged operating mode. In one aspect, when the negative surged operating mode is applied, the bipolar junction transistor having a lateral conducting path is formed, and the lateral conducting path comprises at least one lateral n-p-n bipolar junction transistor structure. The at least one lateral n-p-n bipolar junction transistor structure is constructed from the third heavily doped region of the first conductivity type, the doped well region of the second conductivity type to the fifth heavily doped region of the first conductivity type, and from the fourth heavily doped region of the first conductivity type, the doped well region of the second conductivity type to the fifth heavily doped region of the first conductivity type.

It draws our attention that when the negative surged operating mode is applied, the bipolar junction transistor having a vertical conducting path may also be formed, and the vertical conducting path comprises at least one diode-like Silicon Controlled Rectifier (SCR) structure which are parallelly connected with two diodes in series. And the at least one diode-like Silicon Controlled Rectifier (SCR) structure is constructed from the eighth heavily doped region of the second conductivity type, the doped layer of the first conductivity type, the doped well region of the second conductivity type, to the fifth heavily doped region of the first conductivity type, and from the ninth heavily doped region of the second conductivity type, the doped layer of the first conductivity type, the doped well region of the second conductivity type, to the fifth heavily doped region of the first conductivity type.

And furthermore, according to one another variant embodiment of the present invention, the above mentioned first conductivity type and second conductivity type are certainly not limited to the foregoing disclosed embodiments as an N type and a P type, respectively. In the variant embodiment of the present invention, the first conductivity type may alternatively be a P type, and the second conductivity type will be an N type. According to such another variant embodiment, the first pin is electrically coupled to a low voltage level, and the second pin is electrically coupled to a high voltage level which is greater than the low voltage level of the first pin.

And yet, according to one further variant embodiment of the present invention, the bipolar junction transistor with lateral and vertical conducting paths may additionally further include an implant buried layer of the first conductivity type, which is disposed on the semiconductor substrate of the first conductivity type and underneath the doped layer of the first conductivity type.

And in addition, a first well region of the first conductivity type and a second well region of the first conductivity type may also be further disposed in the doped layer of the first conductivity type for respectively accommodating the sixth heavily doped region of the first conductivity type and the seventh heavily doped region of the first conductivity type. By such configuration, it is believed that the sixth heavily doped region of the first conductivity type is disposed in the first well region of the first conductivity type, and the seventh heavily doped region of the first conductivity type is disposed in the second well region of the first conductivity type.

And yet, when regarding further disposing the first well region of the first conductivity type and the second well region of the first conductivity type in the doped layer of the first conductivity type for respectively accommodating the sixth heavily doped region of the first conductivity type and the seventh heavily doped region of the first conductivity type, the above mentioned implant buried layer of the first conductivity type, which is disposed on the semiconductor substrate of the first conductivity type and underneath the doped layer of the first conductivity type may be optionally configured if necessary. The present invention is certainly not limited thereto.

To sum up, it should be noted that according to the foregoing disclosed technical contents provided by the Applicant, the present invention is certainly not limited thereto by the above-mentioned embodiments. In other words, for people who are skilled in the art and having ordinary understandings and technical backgrounds to the present invention, it would be allowed for them to make various modifications or changes depending on different circuit regulations and/or specifications without departing from the scope of the invention. That is to say, the present invention is certainly not limited thereto. And the variant embodiments and/or circuit implementations should still fall into the claim scope of the present invention.

In general, those skilled in the art and having general knowledge are able to make appropriate modifications or variations with respective to the technical contents disclosed in the present invention without departing from the spirits of the present invention. The present invention is not restricted by the certain limited configurations and/or circuit diagrams disclosed in the embodiments of the present invention. As such, it is believed that the modifications or variations should still fall into the scope of the present invention, and the present invention covers the modifications and its equality.

As a result, based on the disclosed technical features illustrated as above, it is evident that the present invention is sophisticatedly designed and indeed discloses a novel modified scheme for a new bipolar junction transistor structure to be developed with both lateral conducting paths and vertical conducting paths to be formed. By adopting the present invention, it is believed that the present invention achieves in effectively eliminating the conventional drawback issues occurring in the prior arts. In addition, since the first pin and the second pin connected thereto by the present invention, are disposed on a same surface of the bipolar junction transistor structure, it is apparent that, the traditional backside metallization process in the prior arts is thus omitted. And therefore, the circuit complexity for implementing such the disclosed bipolar junction transistor structure can also be made to be relatively low.

As a result, it is believed that the proposed bipolar junction transistor with lateral and vertical conducting paths disclosed by the present invention, is beneficial in view of a great number of merits. Thus, it is believed that the present invention is extremely advantageous while compared to the prior arts.

These and other objectives of the present invention will become obvious to those of ordinary skill in the art after reading the following detailed description of preferred embodiments. And it is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
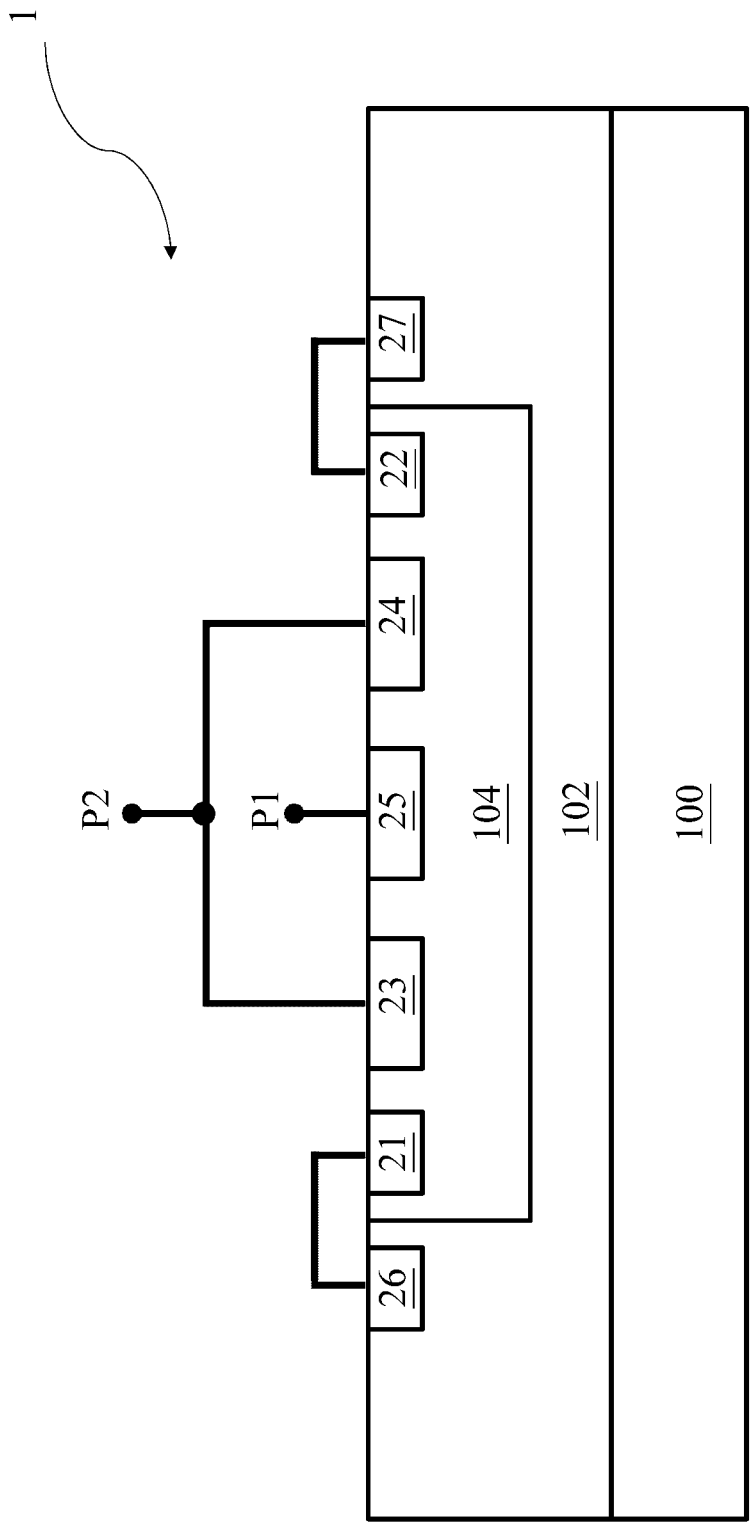
FIG. 1 schematically shows a structural diagram of a proposed bipolar junction transistor with lateral and vertical conducting paths in accordance with one embodiment of the present invention.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that it is not intended to limit the scope of the present invention. Therefore, any equivalent modification or variation according to the spirit of the present invention is to be also included within the scope of the present invention.

Unless otherwise specified, some conditional sentences or words, such as "can". "could", "might", or "may", usually attempt to express that the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/ without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

As the Applicants have described earlier in the Description of the Prior Art, since the conventional transistor devices are mostly in lack of circuit design flexibility and consuming a great amount of circuit production cost as well as circuit design layout area, the present invention is thus provided and aimed to solve such drawbacks by proposing a novel and inventive transistor structure. The Applicants of the Application propose a novel bipolar junction transistor which is characterized by having both lateral and vertical conducting paths, disclosed in the present invention. The provided bipolar junction transistor with lateral and vertical conducting paths will now be provided and illustrated by a plurality of variant embodiments as described in the following sections for references.

At first, please refer to FIG. 1, which schematically shows a structural diagram of a proposed bipolar junction transistor with lateral and vertical conducting paths in accordance with one embodiment of the present invention. According to the present invention, the proposed bipolar junction transistor with lateral and vertical conducting paths 1 includes a semiconductor substrate 100, a doped layer 102, a doped well region 104, a first heavily doped region 21, a second heavily doped region 22, a third heavily doped region 23, a fourth heavily doped region 24, a fifth heavily doped region 25, a sixth heavily doped region 26, and a seventh heavily doped region 27. According to the present invention, the semiconductor substrate 100 has a first conductivity type. And, the doped layer 102 has the first conductivity type and is formed on the semiconductor substrate 100. The doped well region 104, on the contrary, has a second conductivity type, which is opposite to the first conductivity type of the semiconductor substrate 100 and the doped layer 102. And, the doped well region 104 of the second conductivity type is formed in the doped layer 102 of the first conductivity type.

According to the present invention, the first heavily doped region 21 has the second conductivity type, the second heavily doped region 22 has the second conductivity type, the third heavily doped region 23 has the first conductivity type, the fourth heavily doped region 24 has the first conductivity type, and the fifth heavily doped region 25 has the first conductivity type. And the first heavily doped region 21 of the second conductivity type, the second heavily doped region 22 of the second conductivity type, the third heavily doped region 23 of the first conductivity type, the fourth heavily doped region 24 of the first conductivity type and the fifth heavily doped region 25 of the first conductivity type are disposed in the doped well region 104 of the second conductivity type. As can be seen in FIG. 1, the fifth heavily doped region 25 of the first conductivity type is electrically coupled with a first pin P1. And, the third heavily doped region 23 of the first conductivity type and the fourth heavily doped region 24 of the first conductivity type are electrically connected in common and coupled with a second pin P2.

In addition, a sixth heavily doped region 26 has the first conductivity type and a seventh heavily doped region 27 has the first conductivity type. Both the sixth heavily doped region 26 of the first conductivity type and the seventh heavily doped region 27 of the first conductivity type are disposed in the doped layer 102 of the first conductivity type. As referring to the drawing in FIG. 1, it is illustrative that the sixth heavily doped region 26 of the first conductivity type and the seventh heavily doped region 27 of the first conductivity type are spaced apart by the doped well region 104 of the second conductivity type. And, the first heavily doped region 21 of the second conductivity type and the second heavily doped region 22 of the second conductivity type are spaced apart by the third heavily doped region 23 of the first conductivity type, the fourth heavily doped region 24 of the first conductivity type and the fifth heavily doped region 25 of the first conductivity type in the doped well region 104 of the second conductivity type.

According to FIG. 1, the sixth heavily doped region 26 of the first conductivity type is electrically connected with the first heavily doped region 21 of the second conductivity type, and the seventh heavily doped region 27 of the first conductivity type is electrically connected with the second heavily doped region 22 of the second conductivity type.

Figure 2:
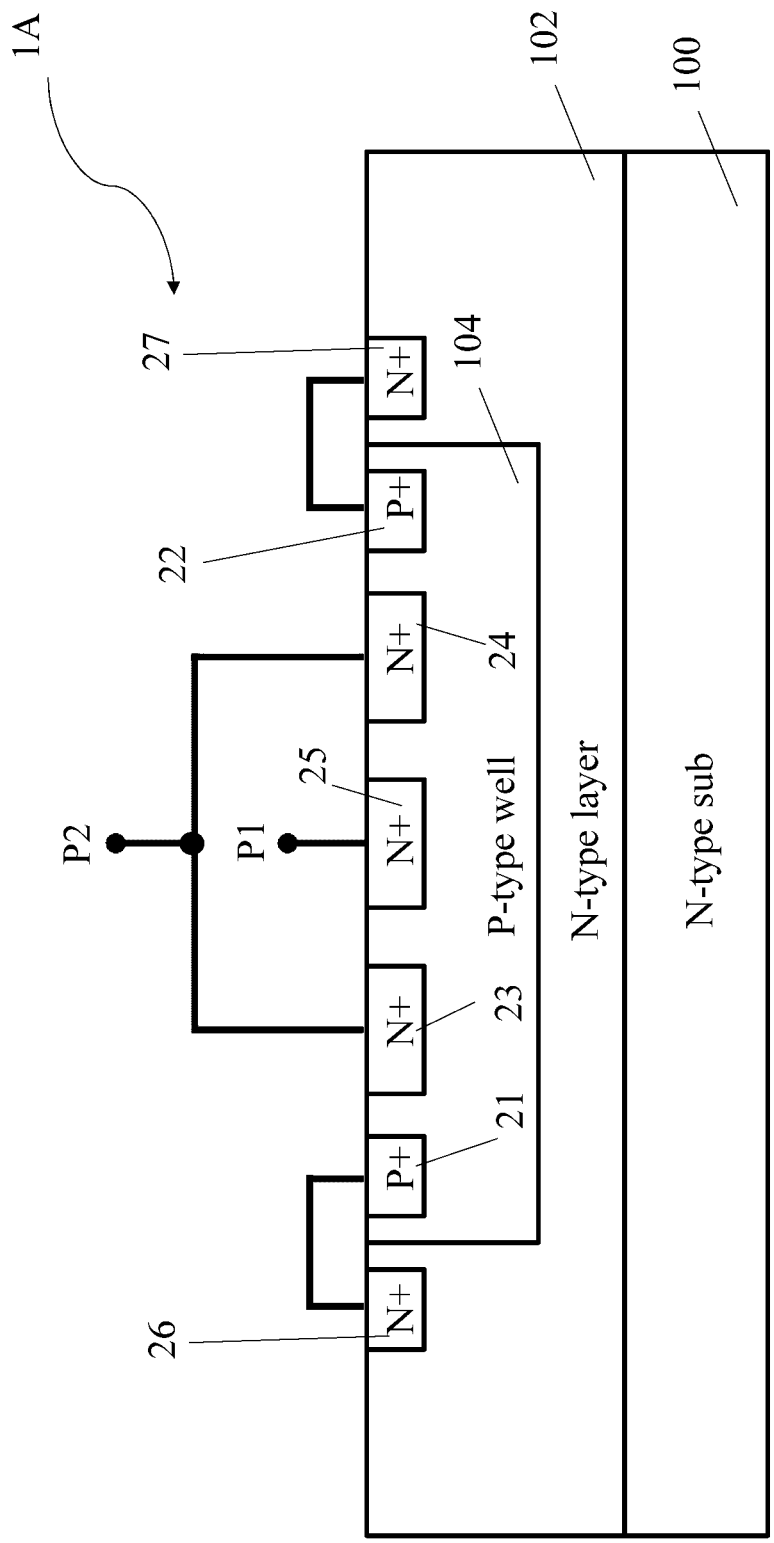
FIG. 2 shows an illustrative embodiment of the bipolar junction transistor with lateral and vertical conducting paths according to FIG. 1 when the first conductivity type and the second conductivity type is an N type and a P type, respectively.

In view of the FIG. 1 scheme, when the first conductivity type is N type, the second conductivity type is P type. And, FIG. 2 shows an illustrative embodiment of the bipolar junction transistor with lateral and vertical conducting paths 1A, according to FIG. 1 when the first conductivity type and the second conductivity type is an N type and a P type, respectively. Under such a circumstance, as can be seen in FIG. 2, the semiconductor substrate 100 of the first conductivity type is an N-type substrate and is illustrated as an "N-type sub", and the doped layer 102 of the first conductivity type, which is formed on the semiconductor substrate 100 of the first conductivity type is an N-type doped layer and is illustrated as an "N-type layer".

When the second conductivity type is P type, the doped well region 104 of the second conductivity type is a P-type doped well region and is illustrated as a "P-type well". In addition, the first heavily doped region 21 of the second conductivity type is a P-type heavily doped region and is illustrated as a "P+" in FIG. 2. Similarly, the second heavily doped region 22 of the second conductivity type is a P-type heavily doped region and is illustrated as a "P+" as well. The third heavily doped region 23 of the first conductivity type, the fourth heavily doped region 24 of the first conductivity type and the fifth heavily doped region 25 of the first conductivity type, on the contrary, are N-type heavily doped regions and are illustrated as "N+" in FIG. 2 embodiment. In addition, the sixth heavily doped region 26 of the first conductivity type and the seventh heavily doped region 27 of the first conductivity type which are disposed in the doped layer 102 of the first conductivity type ("N-type layer") are also N-type heavily doped regions and are illustrated as "N+".

Nevertheless, according to the present invention, the present invention is certainly not limited thereto such embodiment. According to alternative embodiments of the present invention, the first conductivity type may also be illustrative as a P type, and the second conductivity type may be illustrative as an N type as well, and the alternative variations and embodiments may also be made by people who are skilled in the art and having ordinary skills of the art. And yet, the present invention still covers the modifications and its equality based on the disclosed technical contents of the present invention.

Figure 3:
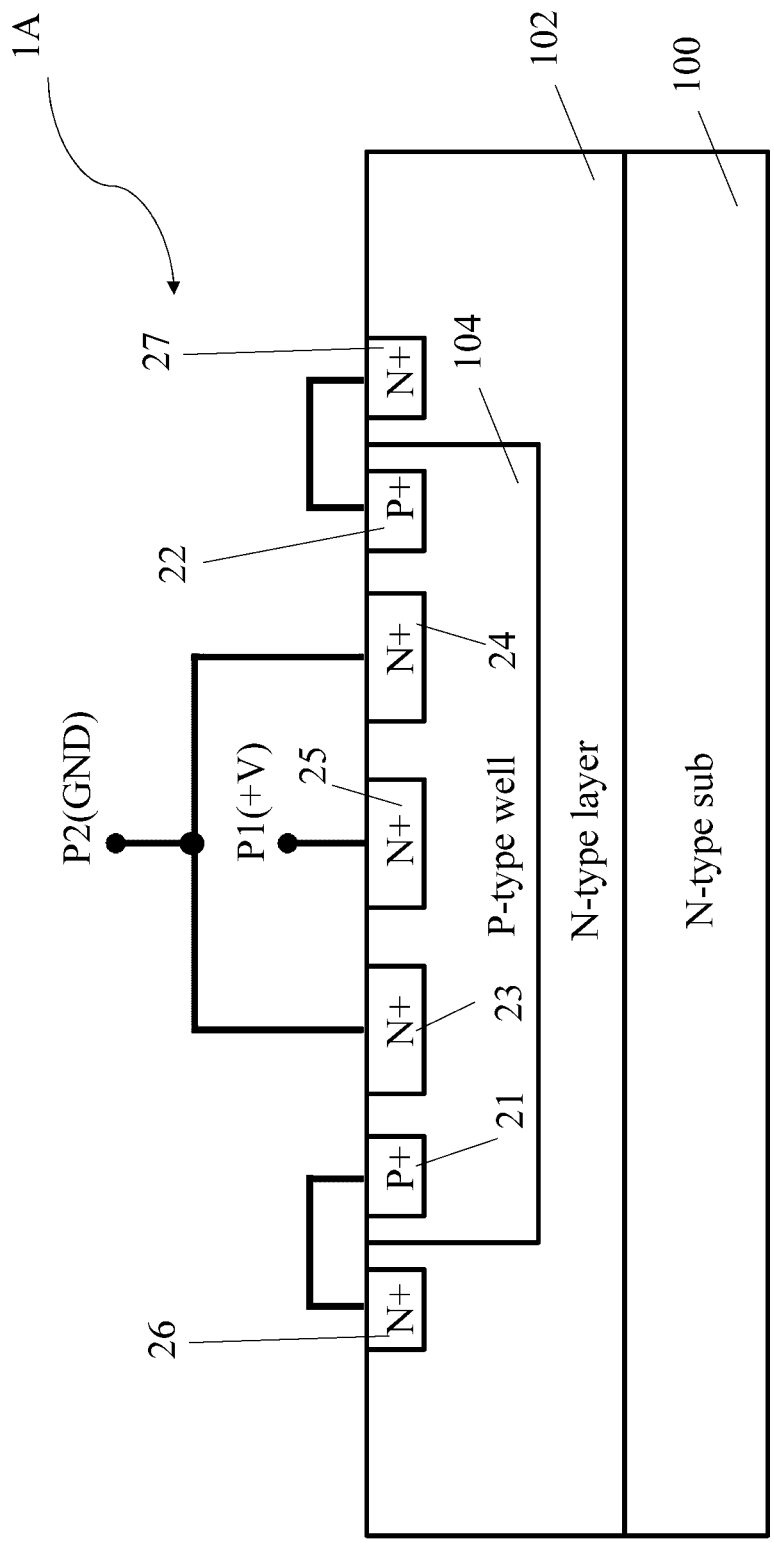
FIG. 3 shows an illustrative embodiment of the bipolar junction transistor with lateral and vertical conducting paths according to FIG. 2 when a positive surged operating mode is applied.
Figure 4:
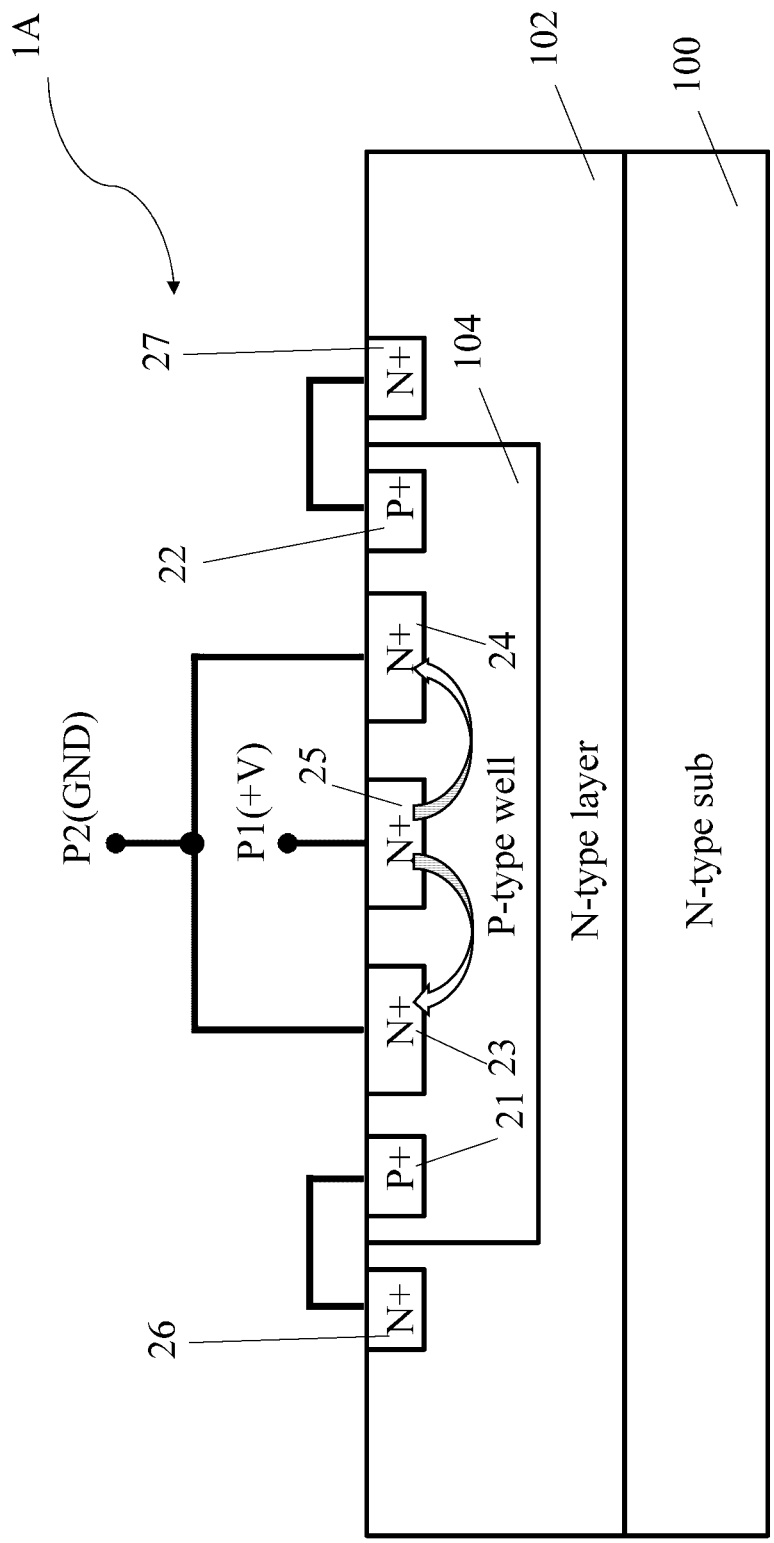
FIG. 4 shows an illustrative embodiment of the bipolar junction transistor with lateral and vertical conducting paths according to FIG. 3 when the lateral conducting path is formed.

Therefore, according to the FIG. 2 embodiment, when the first conductivity type is N type and the second conductivity type is P type, the first pin P1 and the second pin P2 of the disclosed bipolar junction transistor with lateral and vertical conducting paths 1A are electrically coupled to a positive voltage level (+V) and a ground voltage level (GND), respectively so as to provide a positive surged operating mode as shown in FIG. 3. And, when the positive surged operating mode is applied, it is evident that the bipolar junction transistor 1A forms both a lateral conducting path and a vertical conducting path. Please refer to FIG. 4, which schematically shows a drawing of the bipolar junction transistor 1A when the positive surged operating mode is applied, and the current path of the formed lateral conducting path is illustrated by arrows in the figure. As can be seen, the formed lateral conducting path includes two lateral n-p-n bipolar junction transistor structures, wherein one of the lateral n-p-n bipolar junction transistor structures is constructed from the fifth heavily doped region 25 of the first conductivity type (N+), the doped well region 104 of the second conductivity type (P-type well) to the third heavily doped region 23 of the first conductivity type (N+). And the other of the lateral n-p-n bipolar junction transistor structures is constructed from the fifth heavily doped region 25 of the first conductivity type (N+), the doped well region 104 of the second conductivity type (P-type well) to the fourth heavily doped region 24 of the first conductivity type (N+).

Figure 5:
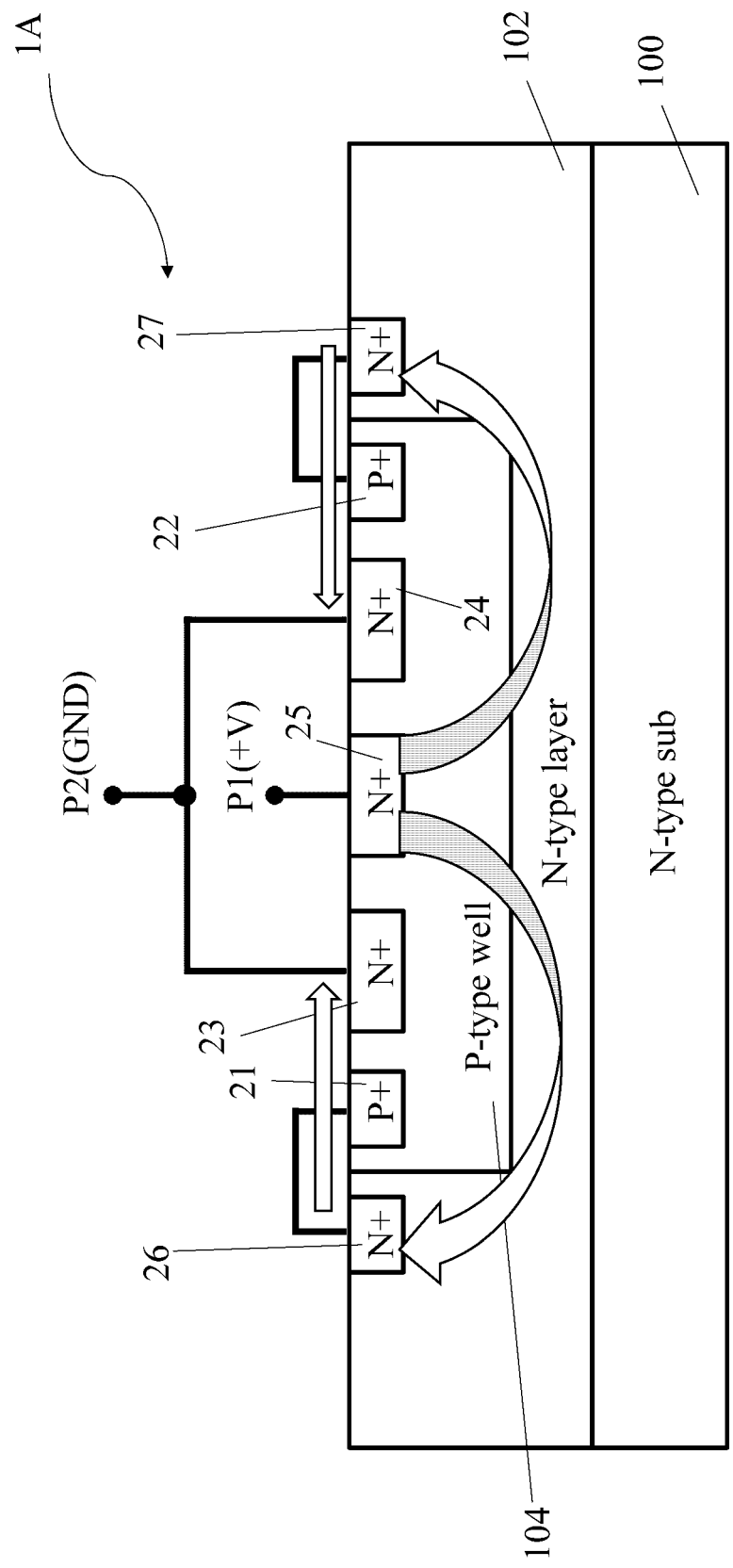
FIG. 5 shows an illustrative embodiment of the bipolar junction transistor with lateral and vertical conducting paths according to FIG. 3 when the vertical conducting path is formed.

Moreover, FIG. 5 schematically shows a drawing of the bipolar junction transistor 1A when the positive surged operating mode is applied, and the vertical conducting path is formed. In FIG. 5, the current path of the formed vertical conducting path is also illustrated by arrows in this figure. As can be seen in FIG. 5, the formed vertical conducting path includes at least one vertical n-p-n bipolar junction transistor structure as well as at least one forward diode which is connected in series with the vertical n-p-n bipolar junction transistor structure.

To be more specific, as referring to FIG. 5, it is illustrative that the at least one vertical n-p-n bipolar junction transistor structure is constructed from the fifth heavily doped region 25 of the first conductivity type (N+), the doped well region 104 of the second conductivity type (P-type well), the doped layer 102 of the first conductivity type (N-type layer) to the sixth heavily doped region 26 of the first conductivity type (N+), which is illustrated as in the left portion of the device structure. Also, another vertical n-p-n bipolar junction transistor structure is constructed from the fifth heavily doped region 25 of the first conductivity type (N+), the doped well region 104 of the second conductivity type (P-type well), the doped layer of 102 the first conductivity type (N-type layer) to the seventh heavily doped region 27 of the first conductivity type (N+), which is illustrated as in the right portion of the device structure.

And additionally, the at least one forward diode which is connected in series with the above-mentioned vertical n-p-n bipolar junction transistor structure is constructed from the sixth heavily doped region 26 of the first conductivity type (N+), the first heavily doped region 21 of the second conductivity type (P+), the doped well region 104 of the second conductivity type (P-type well) to the third heavily doped region 23 of the first conductivity type (N+), which is illustrated as in the left portion of the device structure. And, another forward diode which is connected in series with the vertical n-p-n bipolar junction transistor structure, which is illustrated as in the right portion of the device structure, is constructed from the seventh heavily doped region 27 of the first conductivity type (N+), the second heavily doped region 22 of the second conductivity type (P+), the doped well region 104 of the second conductivity type (P-type well) to the fourth heavily doped region 24 of the first conductivity type (N+).

In view of the above-mentioned descriptions, it is believed that when a positive surged operating mode is applied thereto the disclosed application, the bipolar junction transistor with both lateral and vertical conducting paths is effectively formed.

Figure 6:
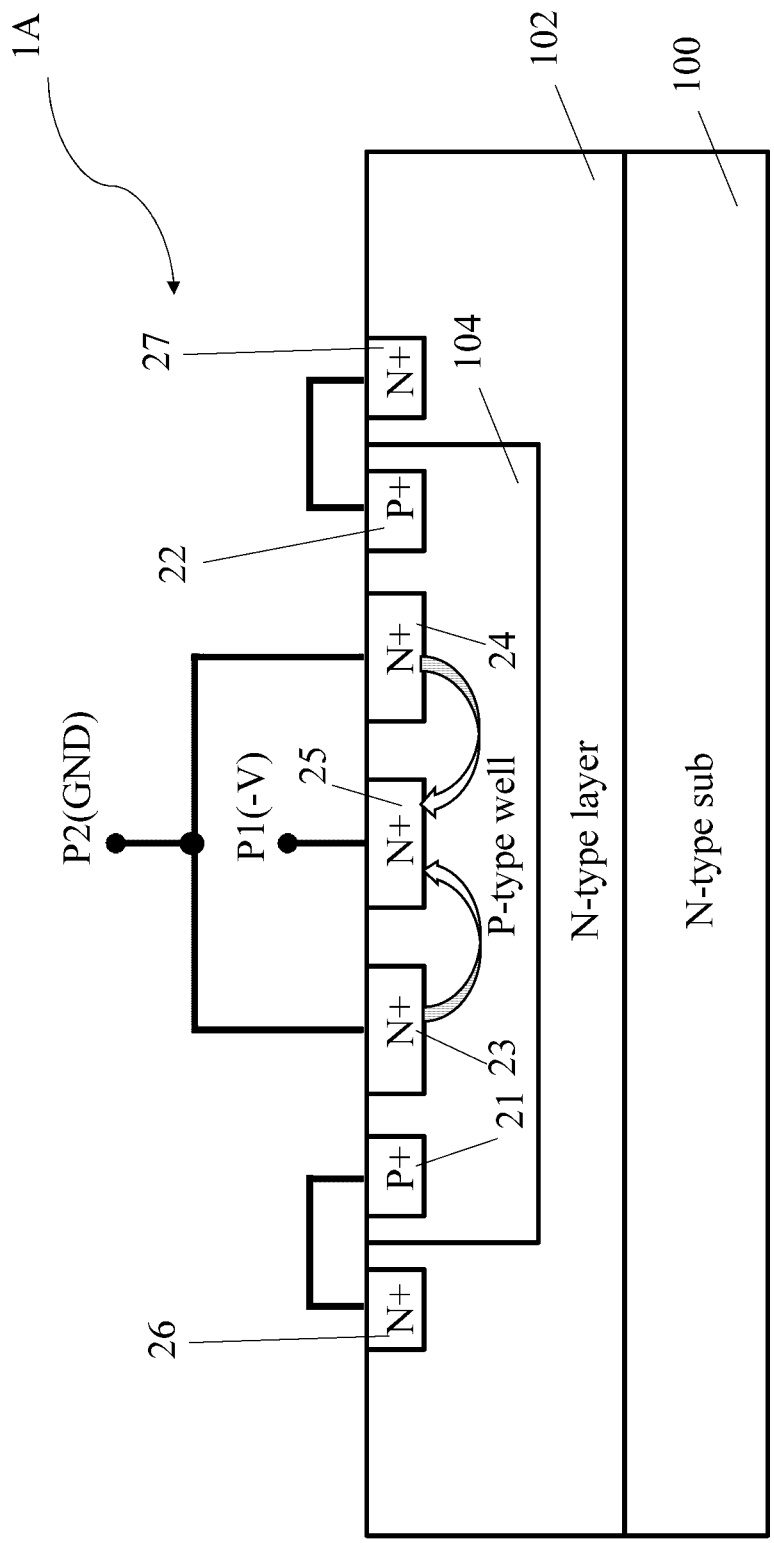
FIG. 6 shows an illustrative embodiment of the bipolar junction transistor with lateral and vertical conducting paths according to FIG. 2 when a negative surged operating mode is applied.

In addition, please refer to FIG. 6, in which a negative surged operating mode may also be applied thereto the disclosed application. FIG. 6 schematically shows a drawing of the bipolar junction transistor 1A when the negative surged operating mode is applied, and the current path of the formed lateral conducting path is illustrated by arrows in the figure. As can be seen in FIG. 6, when the negative surged operating mode is applied to the bipolar junction transistor 1A wherein the first conductivity type is N type and the second conductivity type is P type, then the first pin P1 and the second pin P2 thereof are electrically coupled to a negative voltage level (−V) and a ground voltage level (GND), respectively so as to provide the negative surged operating mode.

As indicated by the arrows in this figure, it is apparent that the formed lateral conducting path includes two lateral n-p-n bipolar junction transistor structures, wherein one of the lateral n-p-n bipolar junction transistor structures is constructed from the third heavily doped region 23 of the first conductivity type (N+), the doped well region 104 of the second conductivity type (P-type well) to the fifth heavily doped region 25 of the first conductivity type (N+). And the other of the lateral n-p-n bipolar junction transistor structures is constructed from the fourth heavily doped region 24 of the first conductivity type (N+), the doped well region 104 of the second conductivity type (P-type well) to the fifth heavily doped region 25 of the first conductivity type (N+).

Figure 7:
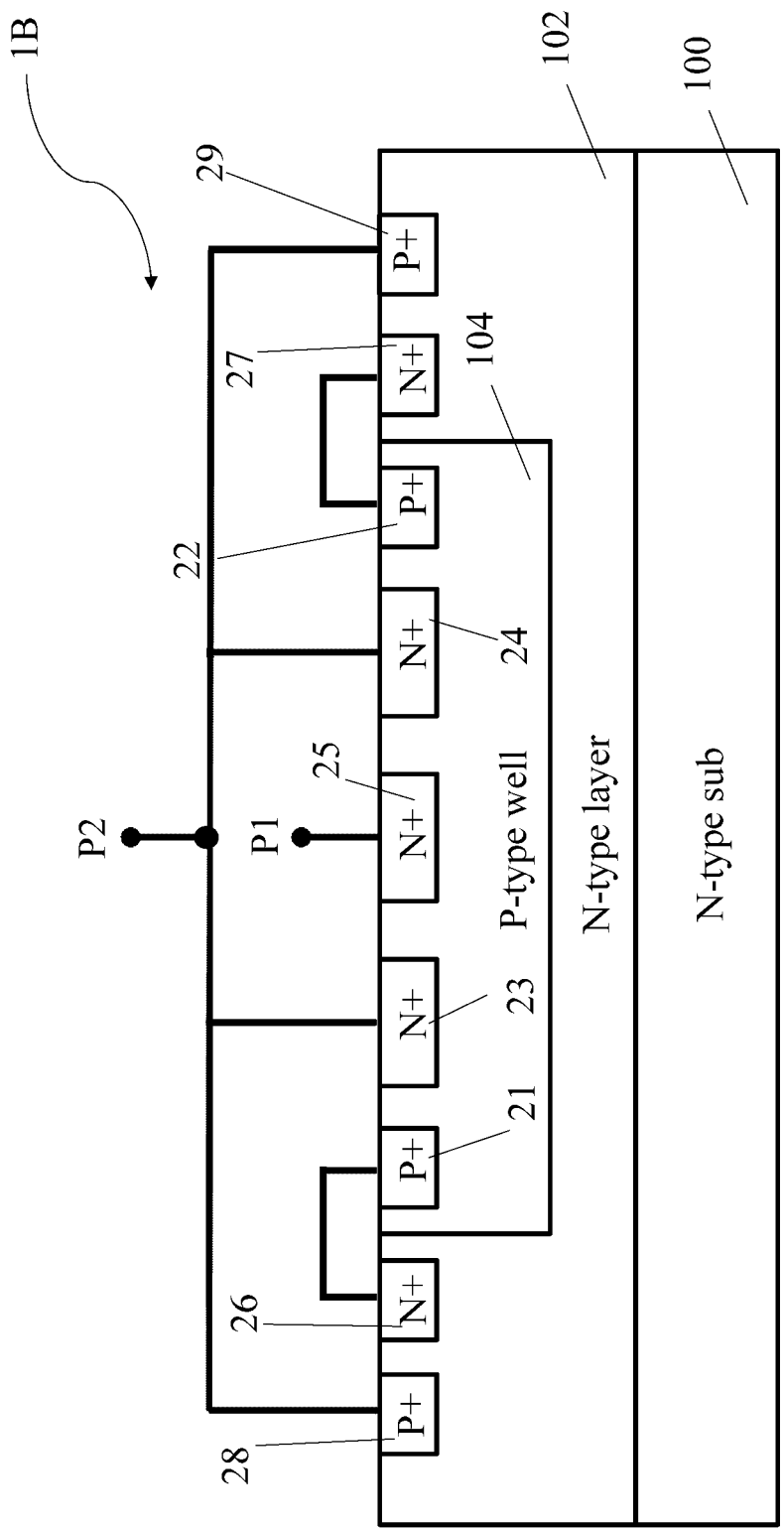
FIG. 7 shows an illustrative embodiment of the bipolar junction transistor with lateral and vertical conducting paths according to FIG. 2 when an eighth heavily doped region of the second conductivity type and a ninth heavily doped region of the second conductivity type are further disposed.

Subsequently. FIG. 7 schematically shows an illustrative variation embodiment of the bipolar junction transistor with lateral and vertical conducting paths 1B, according to the FIG. 2 embodiment, in which the first conductivity type and the second conductivity type is an N type and a P type, respectively. Compared to the FIG. 2 embodiment, in addition to the semiconductor substrate 100 of the first conductivity type (N-type sub), the doped layer 102 of the first conductivity type (N-type layer), the doped well region 104 of the second conductivity type (P-type well), the first heavily doped region 21 of the second conductivity type (P+), the second heavily doped region 22 of the second conductivity type (P+), the third heavily doped region 23 of the first conductivity type (N+), the fourth heavily doped region 24 of the first conductivity type (N+), the fifth heavily doped region 25 of the first conductivity type (N+), the sixth heavily doped region 26 of the first conductivity type (N+) and the seventh heavily doped region 27 of the first conductivity type (N+), the bipolar junction transistor 1B further includes an eighth heavily doped region 28 of the second conductivity type (P+) and a ninth heavily doped region 29 of the second conductivity type (P+), which are being disposed in the doped layer 102 of the first conductivity type (N-type layer). In such a modified embodiment, it is illustrated that the eighth heavily doped region 28 of the second conductivity type (P+), the ninth heavily doped region 29 of the second conductivity type (P+), the third heavily doped region 23 of the first conductivity type (N+), and the fourth heavily doped region 24 of the first conductivity type (N+) are electrically connected in common and coupled with the second pin P2.

Figure 8:
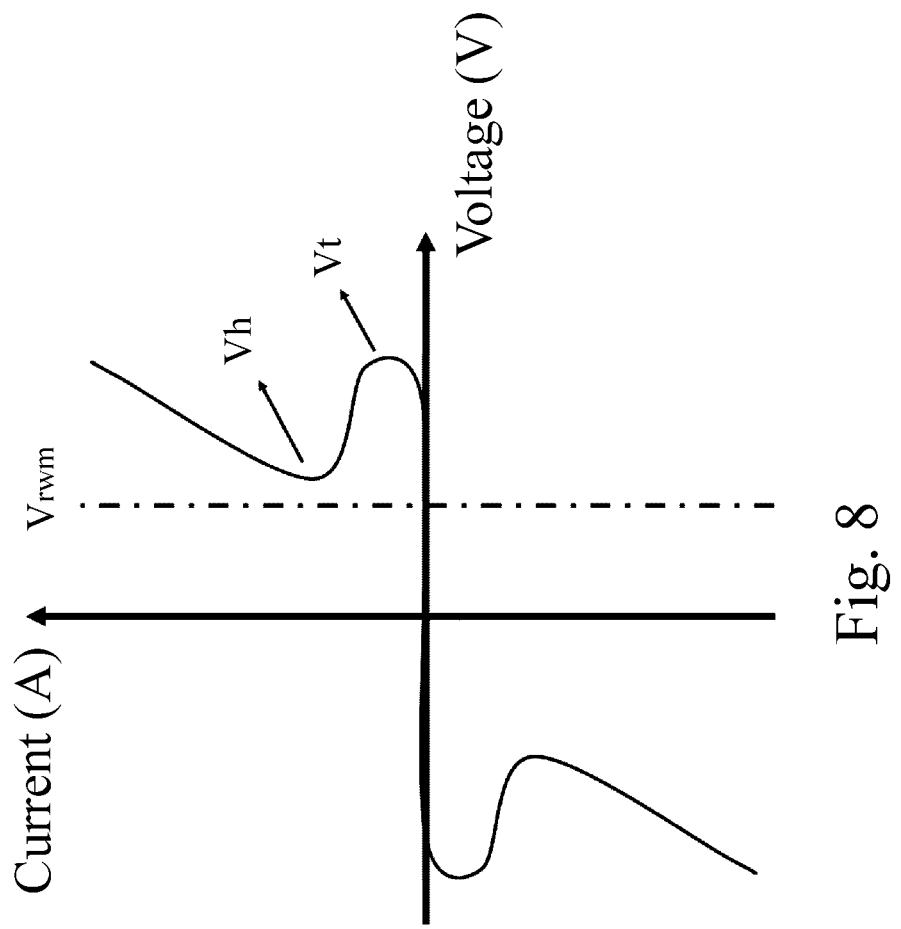
FIG. 8 schematically shows a current-voltage (I-V) curve diagram of the bipolar junction transistor with lateral and vertical conducting paths in accordance with the embodiment in FIG. 2 of the present invention.
Figure 9:
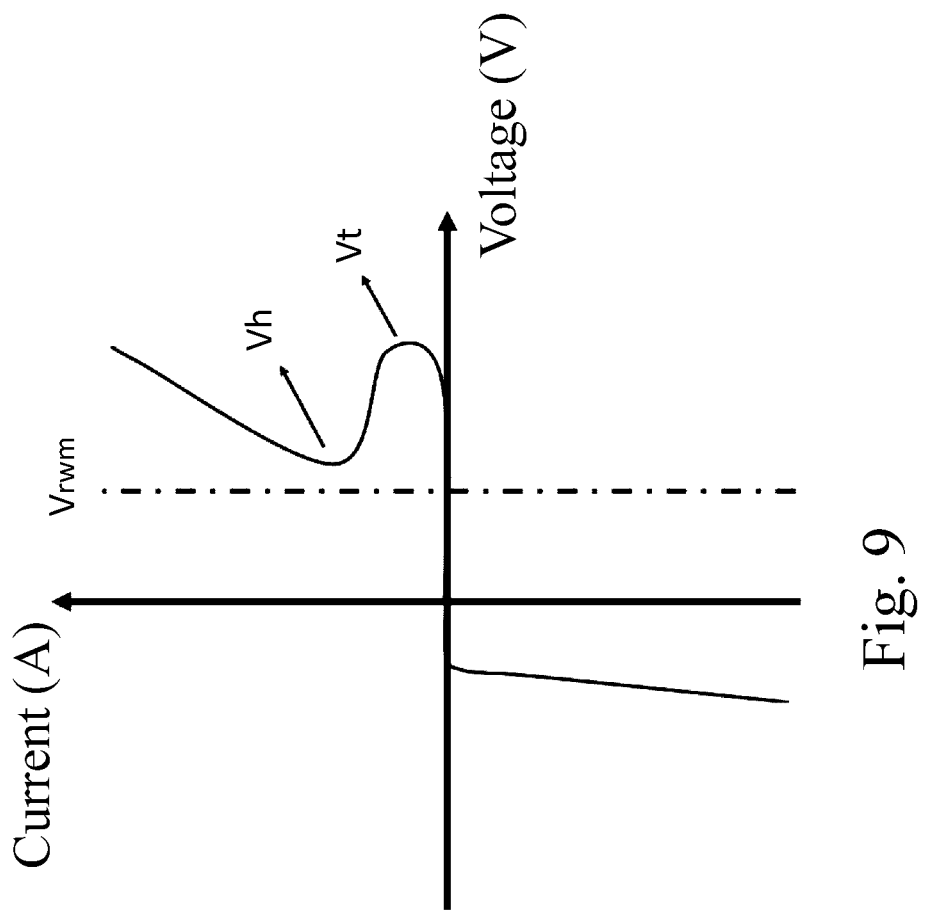
FIG. 9 schematically shows a current-voltage (I-V) curve diagram of the bipolar junction transistor with lateral and vertical conducting paths in accordance with the embodiment in FIG. 7 of the present invention.

Please refer to FIG. 8 for a current-voltage (I-V) curve diagram of the bipolar junction transistor with lateral and vertical conducting paths in accordance with the embodiment in FIG. 2 of the present invention. FIG. 9, on the other hand, shows another current-voltage (I-V) curve diagram of the bipolar junction transistor with lateral and vertical conducting paths in accordance with the embodiment in FIG. 7 of the present invention. As we can see from FIG. 8, it is apparent that the bipolar junction transistor 1A in FIG. 2 is provided as a bi-directional device. And, by further disposing the eighth heavily doped region 28 of the second conductivity type (P+) and the ninth heavily doped region 29 of the second conductivity type (P+) in the doped layer 102 of the first conductivity type (N-type layer), the bipolar junction transistor 1B in FIG. 7 is effectively formed as a uni-directional device. In view of such a modified embodiment in FIG. 7, it is obvious that the present invention achieves to fabricate a uni-directional device of the disclosed bipolar junction transistor with lateral and vertical conducting paths in a plurality of merits, including low process fabrication cost, less circuit layout consumption, and reduced process complexity as well.

Figure 10:
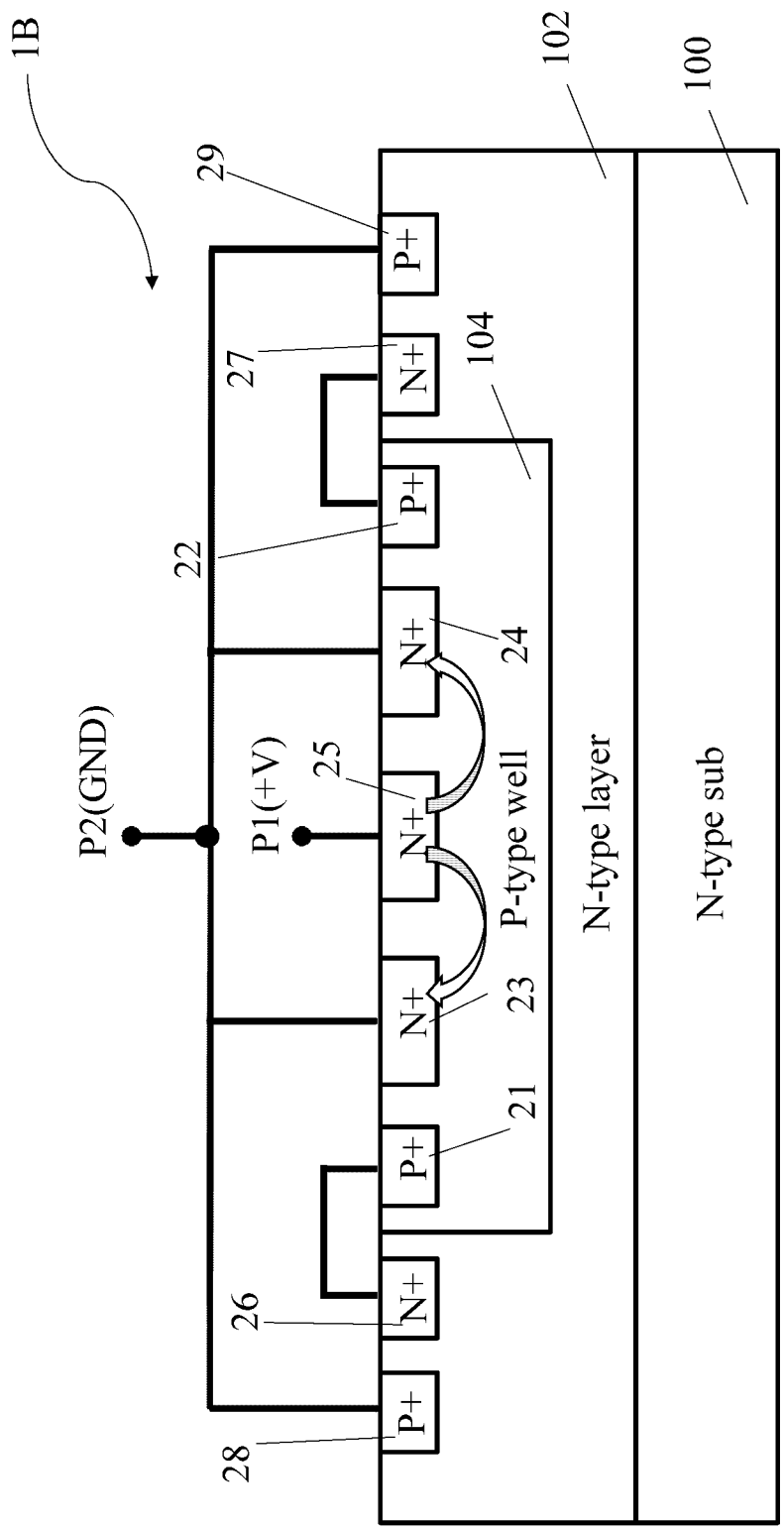
FIG. 10 shows an illustrative embodiment of the bipolar junction transistor with lateral and vertical conducting paths according to FIG. 7 when a positive surged operating mode is applied and the lateral conducting path is formed.
Figure 11:
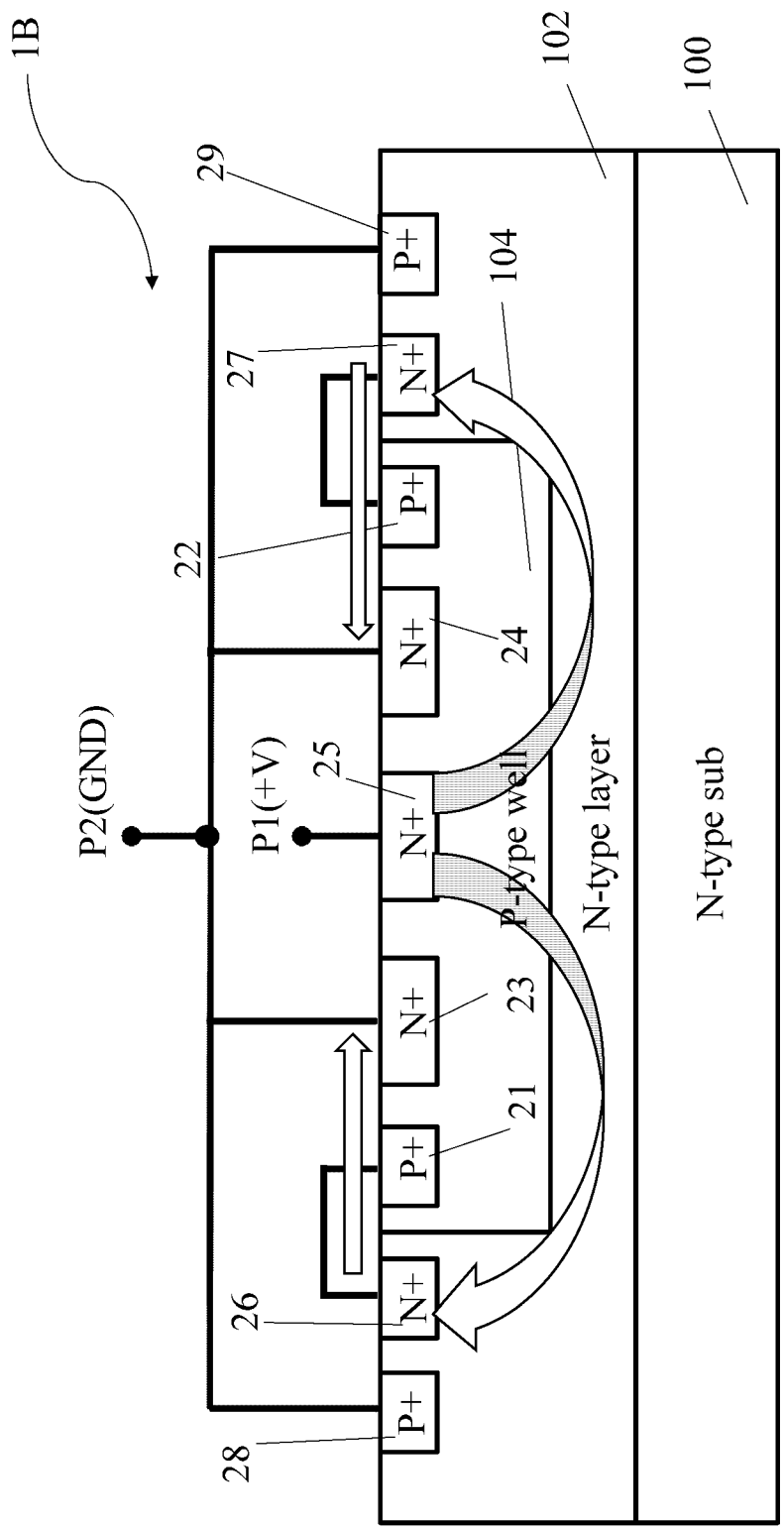
FIG. 11 shows an illustrative embodiment of the bipolar junction transistor with lateral and vertical conducting paths according to FIG. 7 when a positive surged operating mode is applied and the vertical conducting path is formed.

Therefore, according to the FIG. 7 embodiment, when the first conductivity type is N type and the second conductivity type is P type, the first pin P1 and the second pin P2 of the disclosed bipolar junction transistor 1B are electrically coupled to a positive voltage level (+V) and a ground voltage level (GND), respectively as illustrated in FIG. 10 and FIG. 11, such that a positive surged operating mode is applied to the disclosed bipolar junction transistor 1B.

As shown in FIG. 10, when the positive surged operating mode is applied, the bipolar junction transistor 1B accordingly forms a lateral conducting path, and the current path of the formed lateral conducting path is illustrated by arrows in the figure. As we can see, the lateral conducting path comprises at least one lateral n-p-n bipolar junction transistor structure, in which one of the lateral n-p-n bipolar junction transistor structure is constructed from the fifth heavily doped region 25 of the first conductivity type (N+), the doped well region 104 of the second conductivity type (P-type well) to the third heavily doped region 23 of the first conductivity type (N+). And the other of the lateral n-p-n bipolar junction transistor structure is constructed from the fifth heavily doped region 25 of the first conductivity type (N+), the doped well region 104 of the second conductivity type (P-type well) to the fourth heavily doped region 24 of the first conductivity type (N+).

Moreover, FIG. 11 schematically shows a drawing of the disclosed bipolar junction transistor 1B when the positive surged operating mode is applied, in which the vertical conducting path is formed. In FIG. 11, the current path of the formed vertical conducting path is also illustrated by arrows in this figure. As can be observed in FIG. 11, the formed vertical conducting path includes at least one vertical n-p-n bipolar junction transistor structure as well as at least one forward diode which is connected in series with the vertical n-p-n bipolar junction transistor structure.

To be more specific, as referring to FIG. 11, it is illustrative that the at least one vertical n-p-n bipolar junction transistor structure is constructed from the fifth heavily doped region 25 of the first conductivity type (N+), the doped well region 104 of the second conductivity type (P-type well), the doped layer 102 of the first conductivity type (N-type layer) to the sixth heavily doped region 26 of the first conductivity type (N+), which is illustrated as in the left portion of the device structure. Also, another vertical n-p-n bipolar junction transistor structure is constructed from the fifth heavily doped region 25 of the first conductivity type (N+), the doped well region 104 of the second conductivity type (P-type well), the doped layer of 102 of the first conductivity type (N-type layer) to the seventh heavily doped region 27 of the first conductivity type (N+), which is illustrated as in the right portion of the device structure.

And in addition, the at least one forward diode which is connected in series with the above-mentioned vertical n-p-n bipolar junction transistor structure is constructed from the sixth heavily doped region 26 of the first conductivity type (N+), the first heavily doped region 21 of the second conductivity type (P+), the doped well region 104 of the second conductivity type (P-type well) to the third heavily doped region 23 of the first conductivity type (N+), which is illustrated as in the left portion of the device structure. And, another forward diode which is connected in series with the vertical n-p-n bipolar junction transistor structure, which is illustrated as in the right portion of the device structure, is constructed from the seventh heavily doped region 27 of the first conductivity type (N+), the second heavily doped region 22 of the second conductivity type (P+), the doped well region 104 of the second conductivity type (P-type well) to the fourth heavily doped region 24 of the first conductivity type (N+).

As a result, in view of the current paths as shown in FIG. 10 and FIG. 11 of the present invention, it is believed that when a positive surged operating mode is applied thereto the disclosed bipolar junction transistor 1B, the bipolar junction transistor with both lateral and vertical conducting paths may also be effectively formed.

Figure 12:
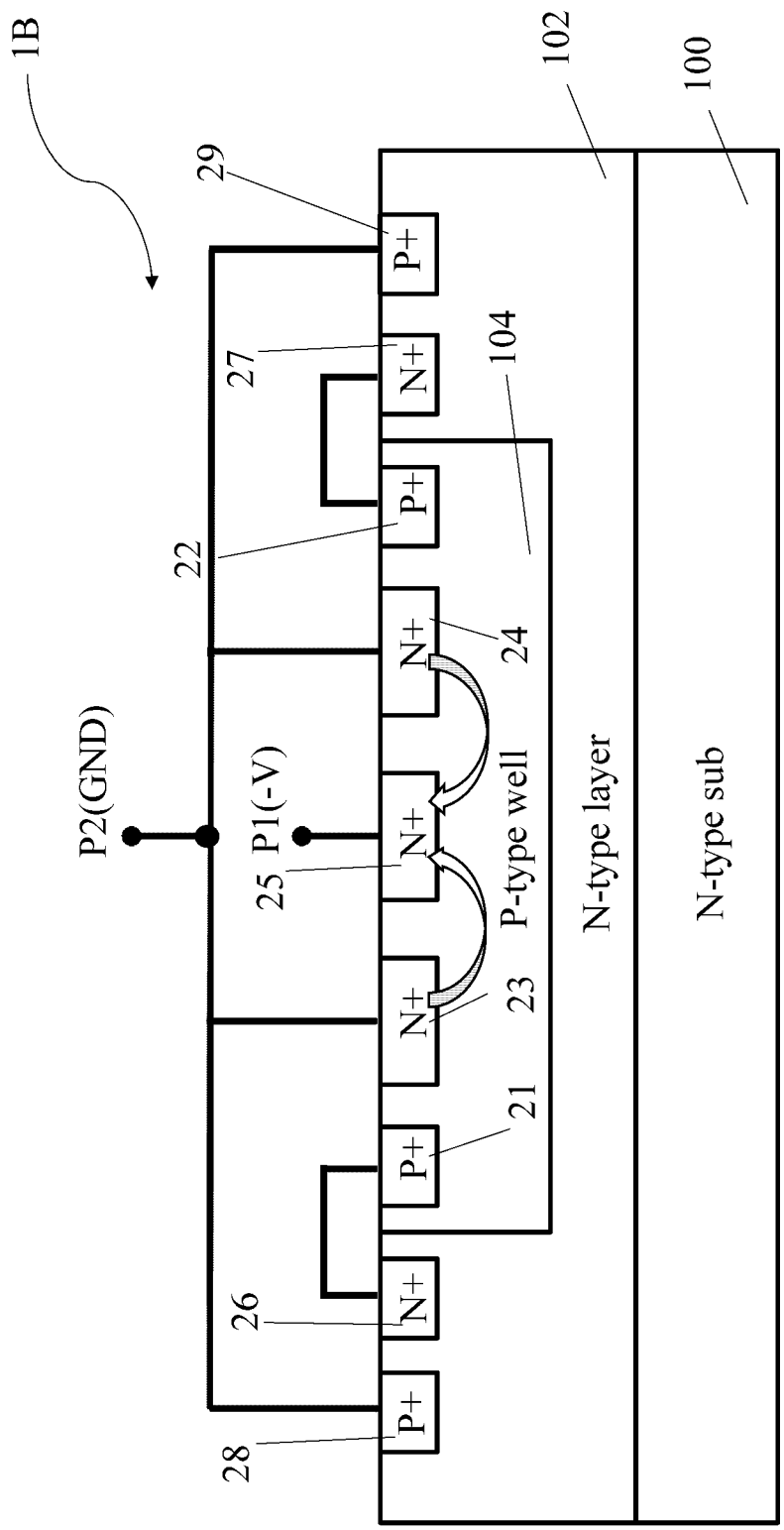
FIG. 12 shows an illustrative embodiment of the bipolar junction transistor with lateral and vertical conducting paths according to FIG. 7 when a negative surged operating mode is applied and the lateral conducting path is formed.
Figure 13:
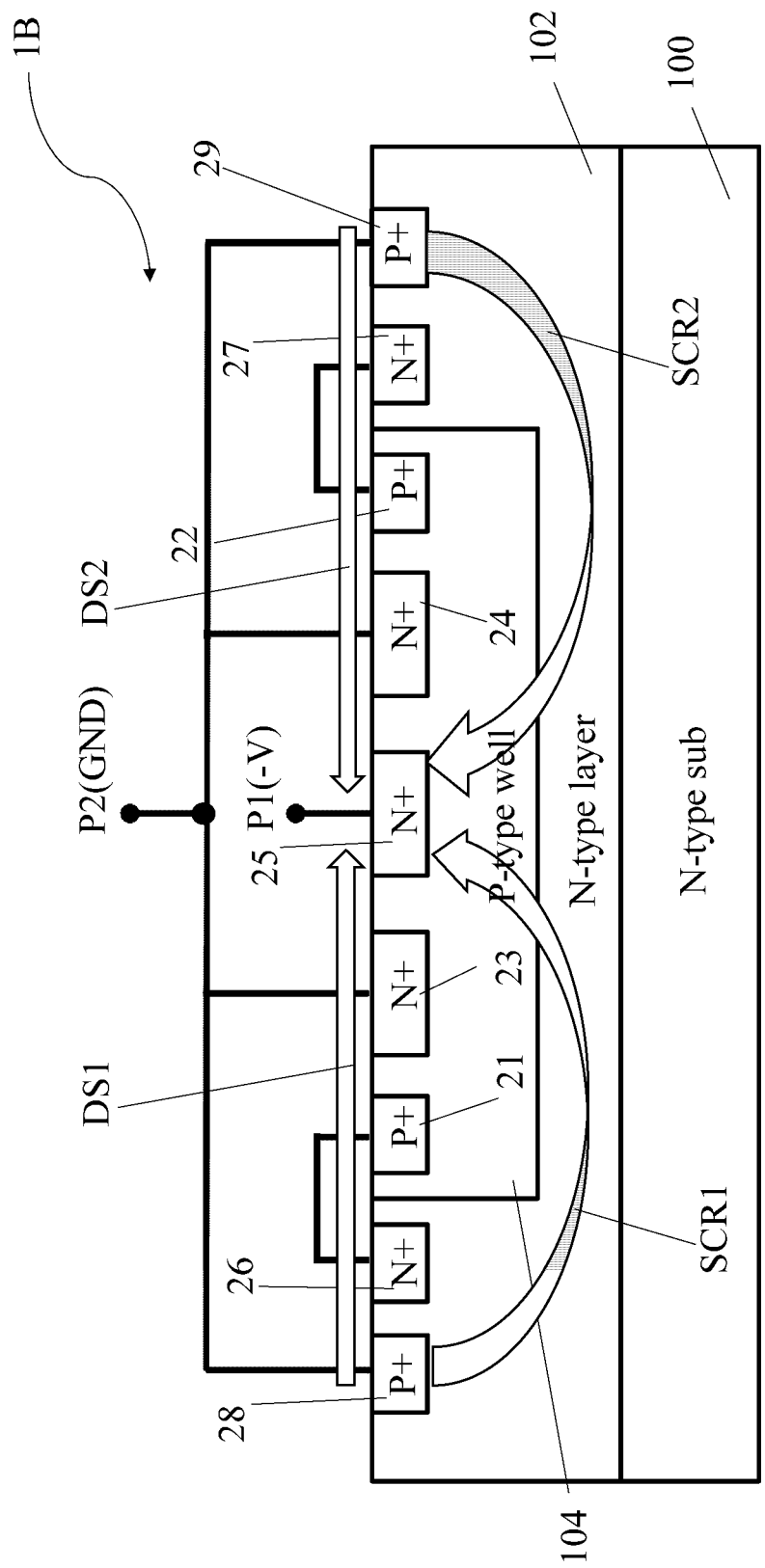
FIG. 13 shows an illustrative embodiment of the bipolar junction transistor with lateral and vertical conducting paths according to FIG. 7 when a negative surged operating mode is applied and the vertical conducting path is formed.

In another aspect, please proceed to refer to FIG. 12 and FIG. 13 for illustrating a negative surged operating mode which may also be applied thereto the disclosed bipolar junction transistor 1B. In FIG. 12, it schematically shows a drawing of the bipolar junction transistor 1B when the negative surged operating mode is applied, and a lateral conducting path is formed. The current path of the formed lateral conducting path is illustrated by arrows in the figure. As we can see in FIG. 12, when the negative surged operating mode is applied to the bipolar junction transistor 1B wherein the first conductivity type is N type and the second conductivity type is P type, then the first pin P1 and the second pin P2 thereof are electrically coupled to a negative voltage level (−V) and a ground voltage level (GND), respectively so as to provide the negative surged operating mode.

As indicated by the arrows in this figure, it can be seen that when the negative surged operating mode is applied, the formed lateral conducting path comprises at least one lateral n-p-n bipolar junction transistor structure. One of the lateral n-p-n bipolar junction transistor structures is constructed from the third heavily doped region 23 of the first conductivity type (N+), the doped well region 104 of the second conductivity type (P-type well) to the fifth heavily doped region 25 of the first conductivity type (N+). And the other of the lateral n-p-n bipolar junction transistor structures is constructed from the fourth heavily doped region 24 of the first conductivity type (N+), the doped well region 104 of the second conductivity type (P-type well) to the fifth heavily doped region 25 of the first conductivity type (N+).

In addition to the above-mentioned lateral conducting path shown in FIG. 12, FIG. 13 furthermore, schematically shows a drawing of the bipolar junction transistor 1B when the negative surged operating mode is applied, and a vertical conducting path is formed. The current path of the formed vertical conducting path is illustrated by arrows in the figure.

As we can see from FIG. 13, when the negative surged operating mode is applied to the bipolar junction transistor 1B, the vertical conducting path comprises at least one diode-like Silicon Controlled Rectifier (SCR) structure which are parallelly connected with two diodes in series. Specifically, the at least one diode-like Silicon Controlled Rectifier (SCR) structure is a p-n-p-n silicon controlled rectifier structure, which is constructed from the eighth heavily doped region 28 of the second conductivity type (P+), the doped layer 102 of the first conductivity type (N-type layer), the doped well region 104 of the second conductivity type (P-type well), to the fifth heavily doped region 25 of the first conductivity type (N+), and from the ninth heavily doped region 29 of the second conductivity type (P+), the doped layer 102 of the first conductivity type (N-type layer), the doped well region 104 of the second conductivity type (P-type well), to the fifth heavily doped region 25 of the first conductivity type (N+). The flowing current of the foregoing p-n-p-n silicon controlled rectifier structures is indicated by the current paths "SCR1" and "SCR2" in FIG. 13, and the flowing current of the two diodes in series connection with the p-n-p-n silicon controlled rectifier structures is indicated by the current paths "DS1" and "DS2" in the same figure.

As a result, it is believed that by employing a negative surged operating mode to the disclosed bipolar junction transistor with lateral and vertical conducting paths 1B as a uni-directional device, not only an initial bipolar junction transistor conducting path is retained, but also an additional silicon controlled rectifier conducting path in parallel with two diodes are generated. Therefore, it is apparent that a much lower clamping voltage and low trigger voltage (Vt) of the disclosed Application can be significantly accomplished by employing the proposed bipolar junction transistor with lateral and vertical conducting paths of the present invention.

Furthermore, as previously described in the earlier paragraphs, according to the present invention, the first conductivity type and the second conductivity type of the present invention are certainly not limited by the above-mentioned embodiments. In other words, according to alternative embodiments of the present invention, the first conductivity type may also be illustrative as a P type, and the second conductivity type may be illustrative as an N type as well, and the alternative variations and embodiments may also be made by people who are skilled in the art and having ordinary skills of the art. Please refer to FIG. 14 for a variant embodiment from the FIG. 2 embodiment when the first conductivity type and the second conductivity type is a P type and an N type, respectively. According to such a variant embodiment in FIG. 14, the bipolar junction transistor with lateral and vertical conducting paths 1C includes a semiconductor substrate 100C of the first conductivity type, which is illustrated as a "P-type sub", a doped layer 102C of the first conductivity type, which is illustrated as a "P-type layer", and a doped well region 104C of the second conductivity type, which is illustrated as an "N-type well".

Figure 14:
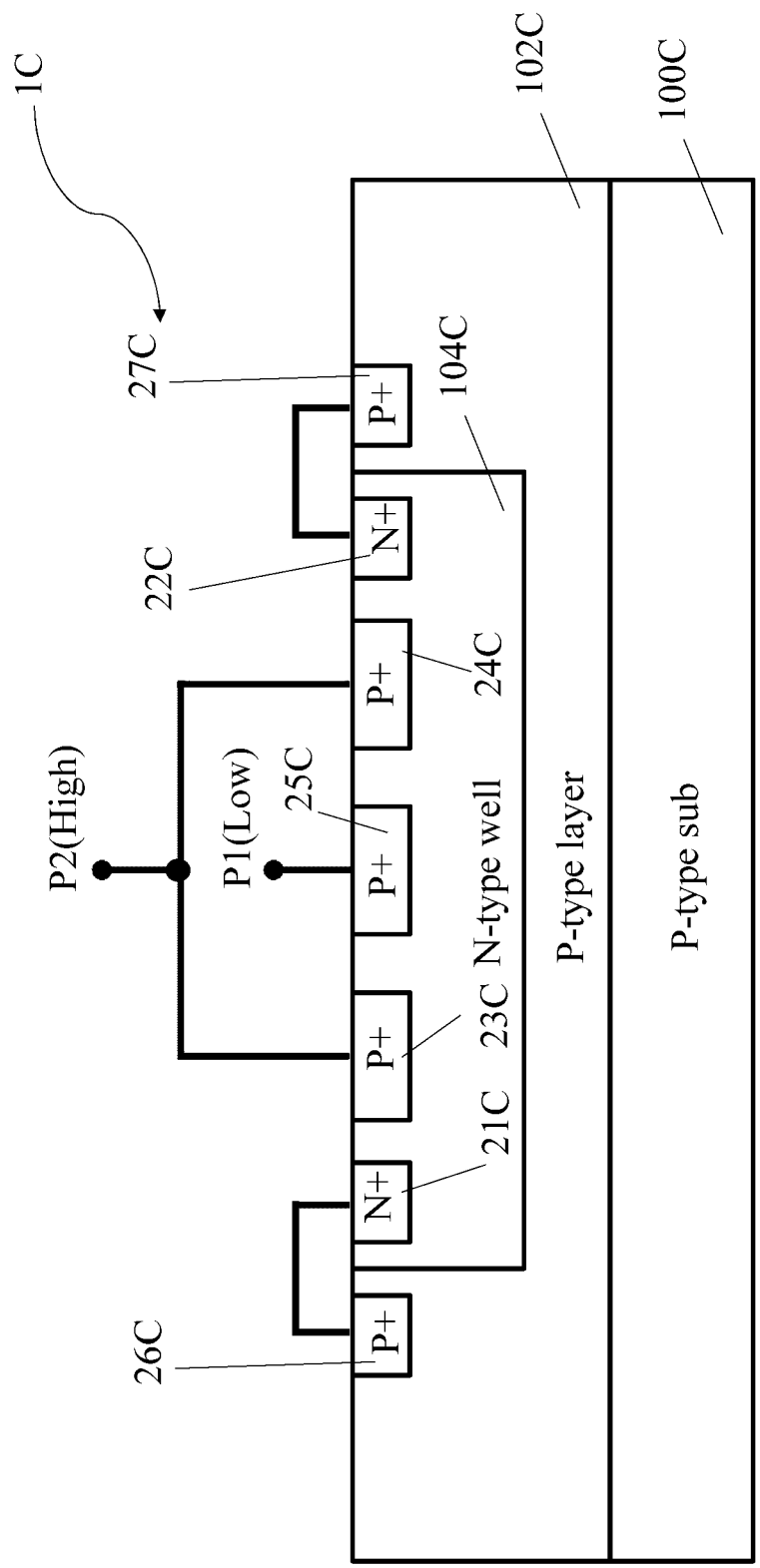
FIG. 14 shows an illustrative embodiment of the bipolar junction transistor with lateral and vertical conducting paths according to FIG. 1 when the first conductivity type and the second conductivity type is a P type and an N type, respectively.

In addition, a first heavily doped region 21C of the second conductivity type is an N-type heavily doped region and is illustrated as an "N+" in FIG. 14. Similarly, the second heavily doped region 22C of the second conductivity type is an N-type heavily doped region and is illustrated as an "N+" as well. The third heavily doped region 23C of the first conductivity type, the fourth heavily doped region 24C of the first conductivity type and the fifth heavily doped region 25C of the first conductivity type, on the contrary, are P-type heavily doped regions and are illustrated as "P+" in the FIG.

14 embodiment. In addition, the sixth heavily doped region 26C of the first conductivity type and the seventh heavily doped region 27C of the first conductivity type which are disposed in the doped layer 102C of the first conductivity type ("P-type layer") are also P-type heavily doped regions and are illustrated as "*P+".

According to the alternative embodiment when the first conductivity type is P type and the second conductivity type is N type, it is determined that the first pin P1 is electrically coupled to a low voltage level, shown as "Low" in FIG. 14 and the second pin P2 is electrically coupled to a high voltage level, shown as "High" in FIG. 14 which is greater than the low voltage level of the first pin P1. In general, the present invention covers the modifications and its equality based on the disclosed technical contents of the present invention regardless of the conductivity types. And such embodiment is still applicable to implement the objectives of the present invention for providing a bipolar junction transistor with both lateral and vertical conducting paths.

Figure 15:
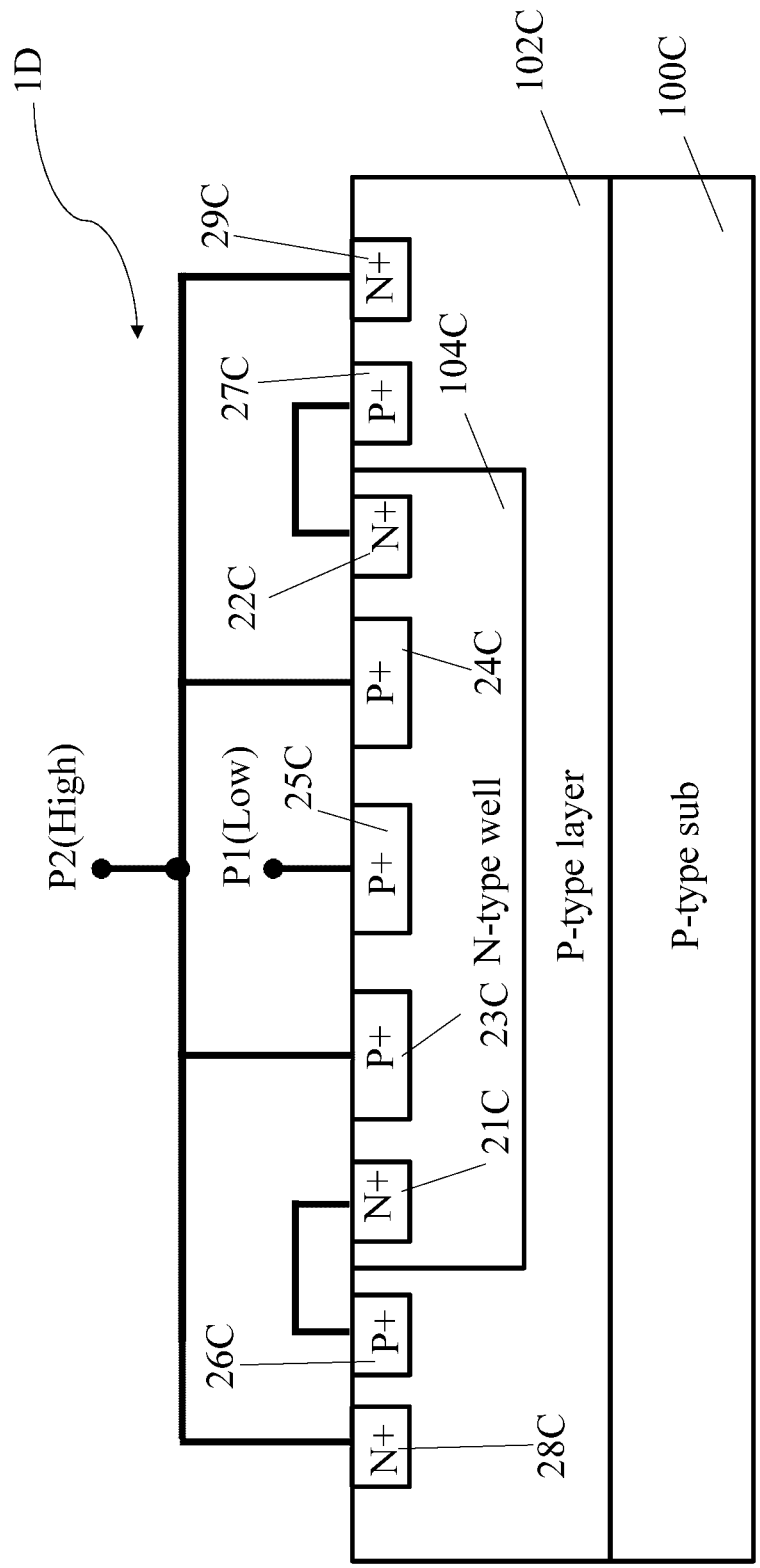
FIG. 15 shows an illustrative embodiment of the bipolar junction transistor with lateral and vertical conducting paths according to FIG. 14 when an eighth heavily doped region of the second conductivity type and a ninth heavily doped region of the second conductivity type are further disposed.

Moreover, FIG. 15 schematically shows a modified embodiment from FIG. 14. As compared with the FIG. 14 embodiment, in addition to the semiconductor substrate 100C of the first conductivity type (P-type sub), the doped layer 102C of the first conductivity type (P-type layer), the doped well region 104C of the second conductivity type (N-type well), the first heavily doped region 21C of the second conductivity type (N+), the second heavily doped region 22C of the second conductivity type (N+), the third heavily doped region 23C of the first conductivity type (P+), the fourth heavily doped region 24C of the first conductivity type (P+), the fifth heavily doped region 25C of the first conductivity type (P+), the sixth heavily doped region 26C of the first conductivity type (P+) and the seventh heavily doped region 27C of the first conductivity type (P+), the bipolar junction transistor ID may further include an eighth heavily doped region 28C of the second conductivity type (N+) and a ninth heavily doped region 29C of the second conductivity type (N+), which are being disposed in the doped layer 102C of the first conductivity type (P-type layer). In such a modified embodiment, it is illustrated that the eighth heavily doped region 28C of the second conductivity type (N+), the ninth heavily doped region 29C of the second conductivity type (N+), the third heavily doped region 23C of the first conductivity type (P+), and the fourth heavily doped region 24C of the first conductivity type (P+) are electrically connected in common and coupled with the second pin P2, in order to form and provide a uni-directional bipolar junction transistor structure.

Figure 16:
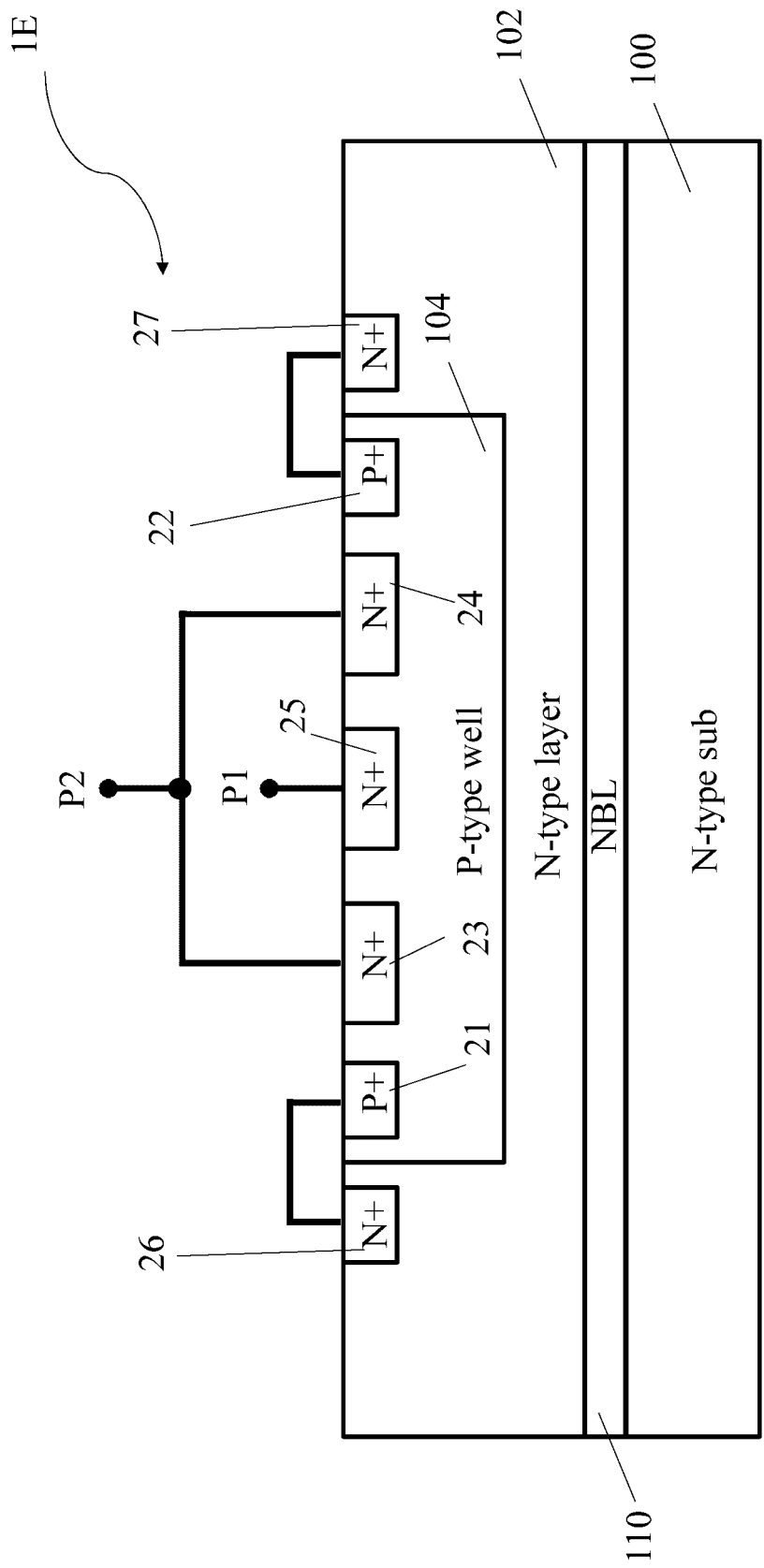
FIG. 16 shows an illustrative embodiment of the bipolar junction transistor with lateral and vertical conducting paths according to FIG. 2 when an implant buried layer of the first conductivity type is further disposed between the semiconductor substrate of the first conductivity type and the doped layer of the first conductivity type.

In addition, please refer to FIG. 16, which schematically shows a structural diagram of a proposed bipolar junction transistor with lateral and vertical conducting paths in accordance with one another embodiment of the present invention. The bipolar junction transistor with lateral and vertical conducting paths 1E according to FIG. 16 further comprises an implant buried layer 110 of the first conductivity type, which is disposed on the semiconductor substrate 100 of the first conductivity type and underneath the doped layer 102 of the first conductivity type. As indicated in FIG. 16, since the first conductivity type is taken as an N-type, it is shown that the implant buried layer 110 of the first conductivity type is illustrated as the "NBL", which is disposed therein between the N-type sub 100 and the N-type layer 102. Compared with the previously disclosed embodiment in FIG. 2, the bipolar junction transistor with lateral and vertical conducting paths 1E is proposed for the purpose of further reducing the resistivity of the transistor device by employing the implant buried layer 110. According to the embodiment of the present invention, the dopant concentration of the implant buried layer 110, for example, can be determined in a range of 1E18~1E19 cm$^{-3}$.

Figure 17:
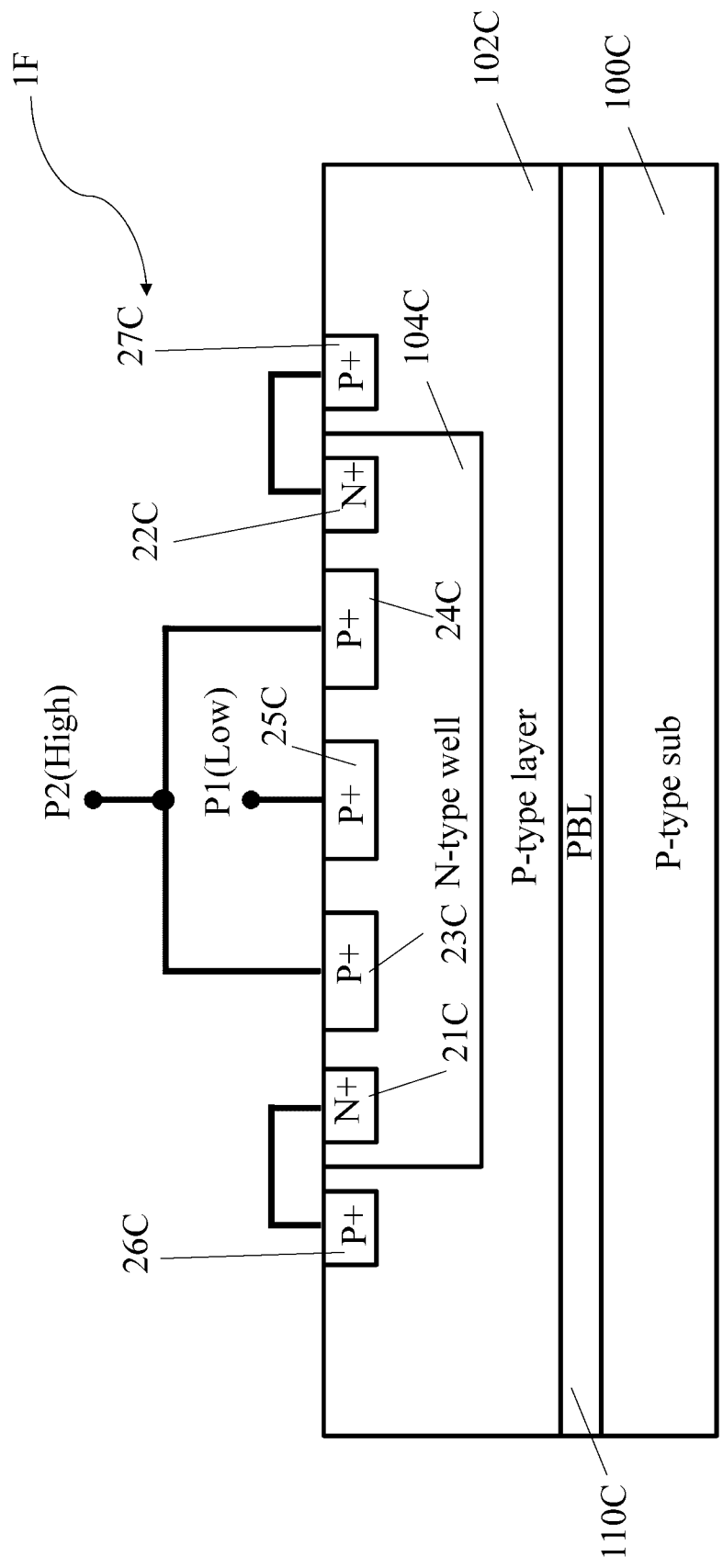
FIG. 17 shows an illustrative embodiment of the bipolar junction transistor with lateral and vertical conducting paths according to FIG. 14 when an implant buried layer of the first conductivity type is further disposed between the semiconductor substrate of the first conductivity type and the doped layer of the first conductivity type.

In the similar methodology, FIG. 17 schematically shows a structural diagram of a proposed bipolar junction transistor with lateral and vertical conducting paths in accordance with one another embodiment of the present invention. In view of the embodiment in FIG. 14, the bipolar junction transistor with lateral and vertical conducting paths IF according to FIG. 17 is a variant embodiment from the bipolar junction transistor with lateral and vertical conducting paths 1C in FIG. 14. As can be seen in FIG. 17, the bipolar junction transistor with lateral and vertical conducting paths IF further comprises an implant buried layer 110C of the first conductivity type, which is disposed on the semiconductor substrate 100C of the first conductivity type and underneath the doped layer 102C of the first conductivity type. As indicated in FIG. 17, since the first conductivity type herein the embodiment is taken as a P-type, it is shown that the implant buried layer 110C of the first conductivity type is illustrated as the "PBL", which is disposed therein between the P-type sub 100C and the P-type layer 102C. Compared with the previously disclosed embodiment in FIG. 14, the bipolar junction transistor with lateral and vertical conducting paths IF is proposed for the purpose of further reducing the resistivity of the transistor device by additionally disposing the implant buried layer 110C. According to the embodiment of the present invention, the dopant concentration of the implant buried layer 110C, for example, can be determined in a range of 1E18~1E19 cm$^{-3}$.

Figure 18:
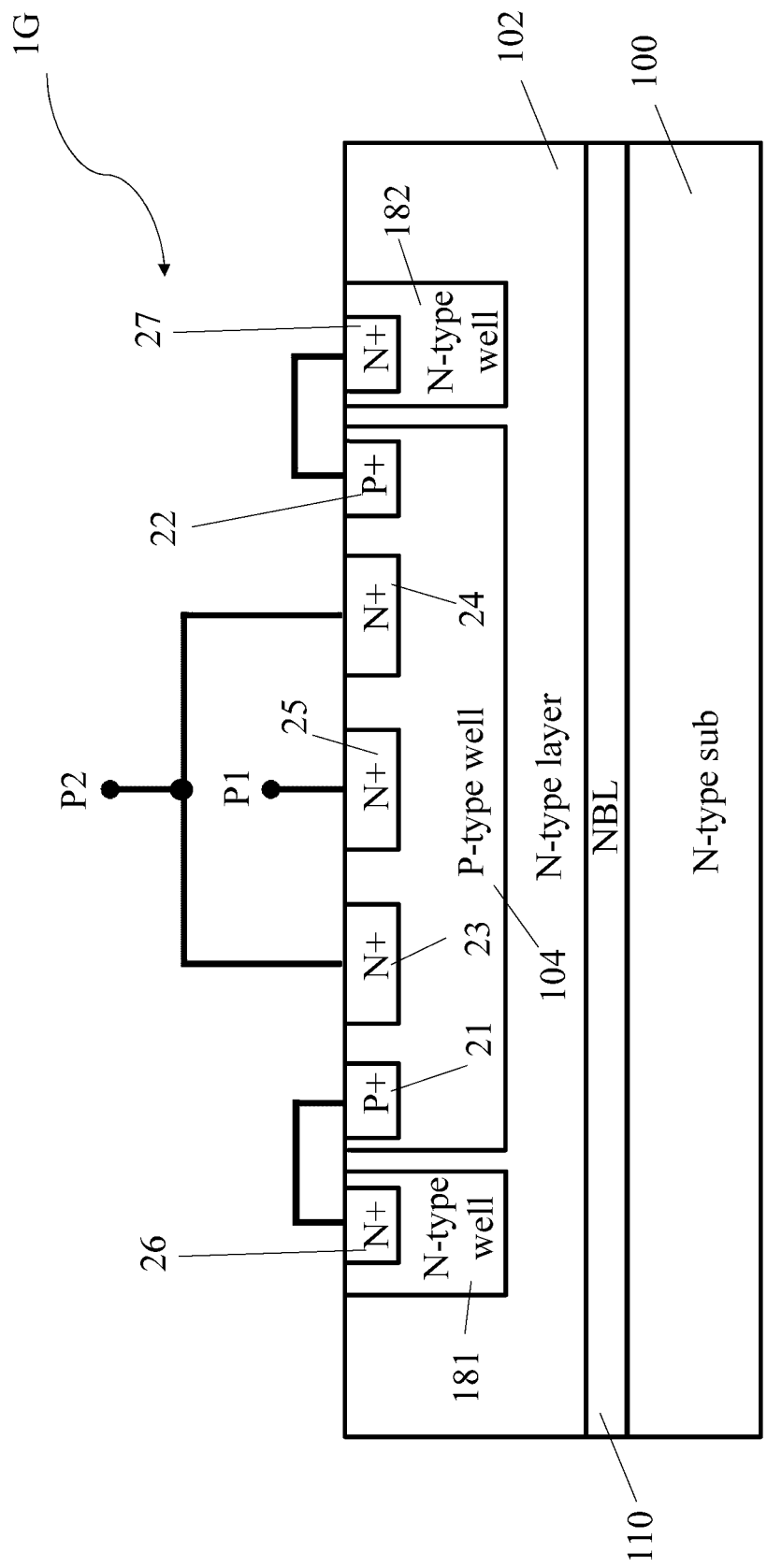
FIG. 18 shows an illustrative embodiment of the bipolar junction transistor with lateral and vertical conducting paths according to FIG. 16 when a first well region of the first conductivity type and a second well region of the first conductivity type are further disposed.

Furthermore, in order to significantly decrease the resistivity of the transistor device, a first well region of the first conductivity type and a second well region of the first conductivity type may also be disposed as well. FIG. 18 shows another structural diagram of a proposed bipolar junction transistor with lateral and vertical conducting paths 1G in accordance with one another embodiment of the present invention. As can be seen, the bipolar junction transistor with lateral and vertical conducting paths 1G further comprises a first well region 181 of the first conductivity type and a second well region 182 of the first conductivity type which are disposed in the doped layer 102 of the first conductivity type. Since the first conductivity type in such embodiment according to FIG. 18, is taken as an N-type, it is shown that the first well region 181 and the second well region 182 of the first conductivity type are illustrated as the "N-type well" such that the sixth heavily doped region 26 of the first conductivity type (N+) is disposed in the first well region 181 of the first conductivity type (N-type well), and the seventh heavily doped region 27 of the first conductivity type (N+) is disposed in the second well region 182 of the first conductivity type (N-type well).

Figure 19:
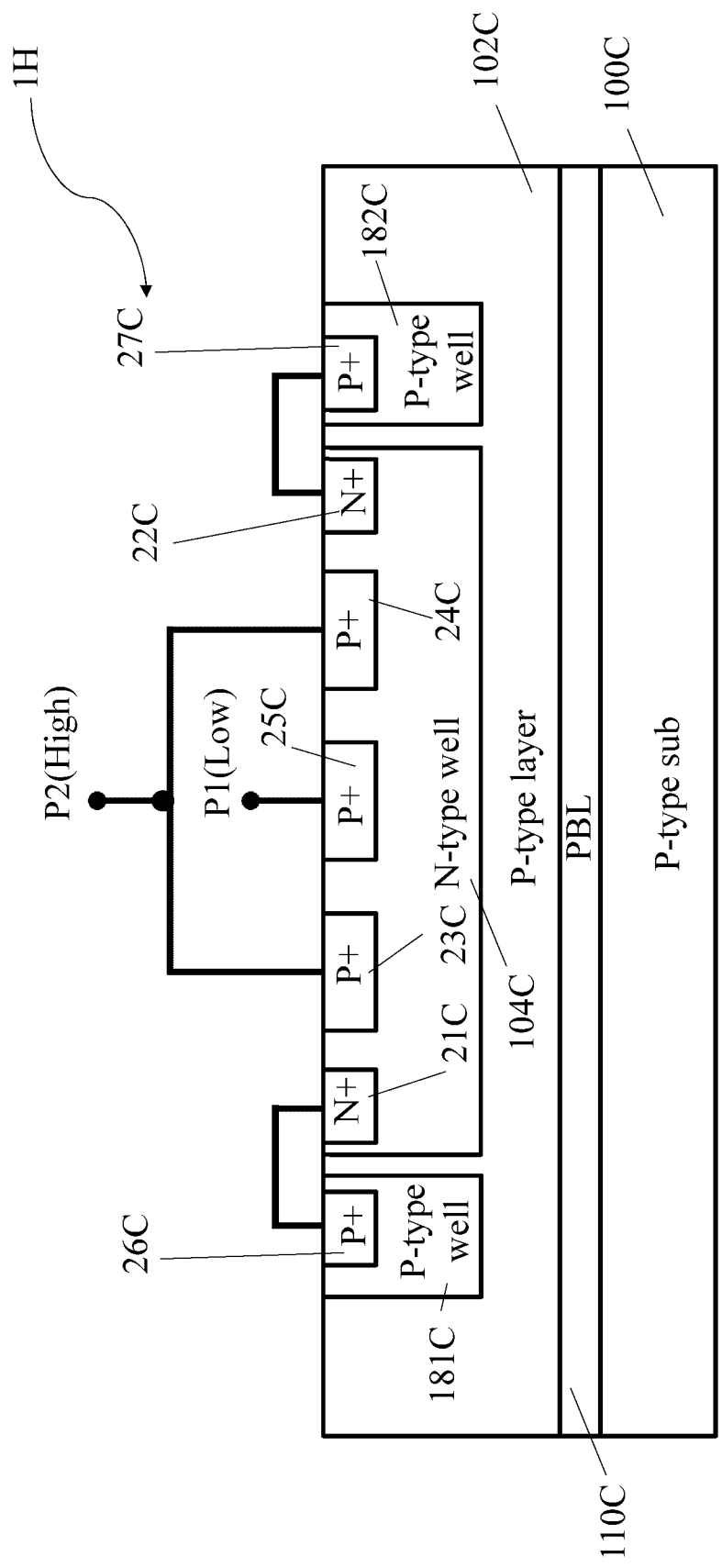
FIG. 19 shows an illustrative embodiment of the bipolar junction transistor with lateral and vertical conducting paths according to FIG. 17 when a first well region of the first conductivity type and a second well region of the first conductivity type are further disposed.

In addition, FIG. 19 schematically shows another structural diagram of a proposed bipolar junction transistor with lateral and vertical conducting paths 1H in accordance with one another embodiment of the present invention. The bipolar junction transistor with lateral and vertical conducting paths 1H is a variant embodiment from the bipolar junction transistor with lateral and vertical conducting paths 1G in FIG. 18. In the embodiment as indicated in FIG. 19, the first conductivity type is P-type, such that the first well region 181C of the first conductivity type and the second well region 182C of the first conductivity type are illustrated as the "P-type well". The sixth heavily doped region 26C of the first conductivity type (P+) is disposed in the first well region 181C of the first conductivity type (P-type well), and the seventh heavily doped region 27C of the first conductivity type (P+) is disposed in the second well region 182C of the first conductivity type (P-type well).

Figure 20:
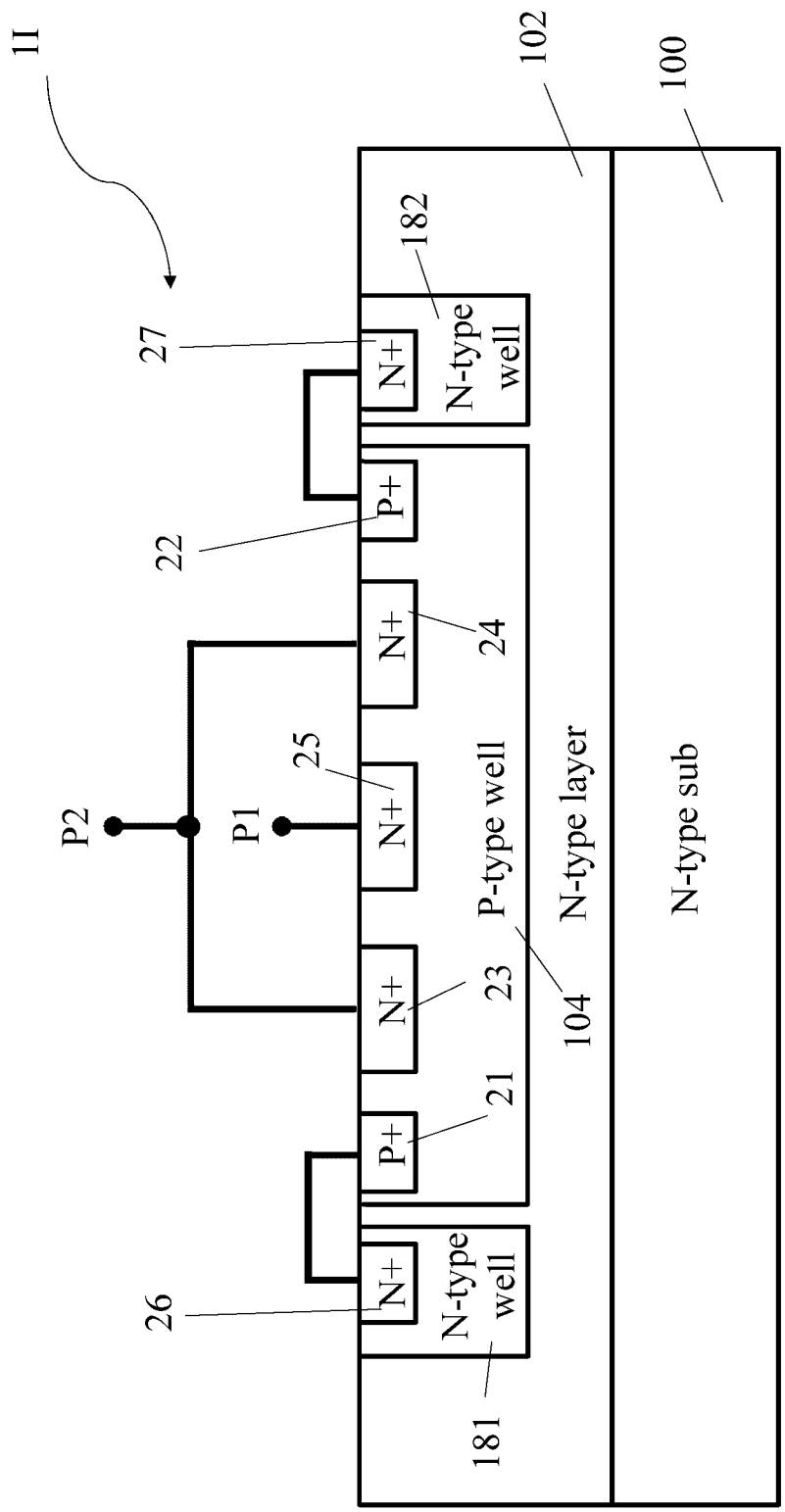
FIG. 20 shows an illustrative embodiment of the bipolar junction transistor with lateral and vertical conducting paths according to FIG. 18, in which the implant buried layer can be alternatively removed.
Figure 21:
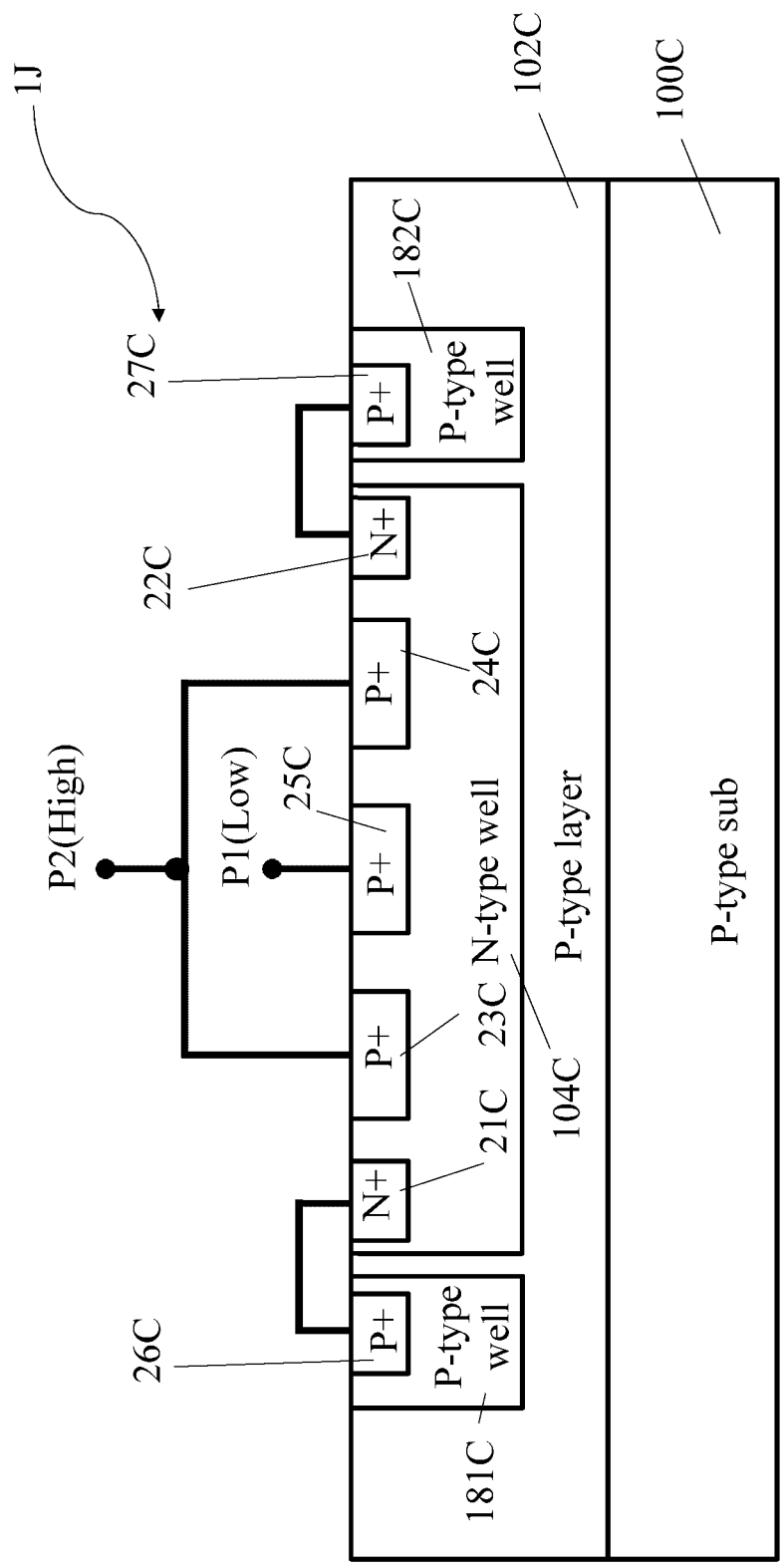
FIG. 21 shows an illustrative embodiment of the bipolar junction transistor with lateral and vertical conducting paths according to FIG. 19, in which the implant buried layer can be alternatively removed.

And moreover, please proceed to refer to FIG. 20 and FIG. 21 for another two modified variant embodiments of the present invention. FIG. 20 schematically shows an illustrative embodiment of the bipolar junction transistor with lateral and vertical conducting paths according to FIG. 18, in which the implant buried layer can be alternatively removed. As can be seen from the bipolar junction transistor with lateral and vertical conducting paths 1I in FIG. 20, it is also applicable to dispose the first well region 181 and the second well region 182 of the first conductivity type (the "N-type well") in the doped layer 102 of the first conductivity type (the "N-type layer") for respectively accommodating the sixth heavily doped region 26 of the first conductivity type (N+) and the seventh heavily doped region 27 of the first conductivity type (N+), under the circumstance that the implant buried layer 110 of the first conductivity type (the "NBL") is alternatively removed. Such modified embodiment may also be used for implementing the inventive effects of the present invention and significantly decreasing the resistivity of the bipolar junction transistor device.

In addition, by applying the similar methodologies, please refer to FIG. 21, which schematically shows another illustrative embodiment of the bipolar junction transistor with lateral and vertical conducting paths according to FIG. 19, in which the implant buried layer can be alternatively removed. As can be seen from the bipolar junction transistor with lateral and vertical conducting paths 1J in FIG. 21, it is also applicable to dispose the first well region 181C and the second well region 182C of the first conductivity type (the "P-type well") in the doped layer 102C of the first conductivity type (the "P-type layer") for respectively accommodating the sixth heavily doped region 26C of the first conductivity type (P+) and the seventh heavily doped region 27C of the first conductivity type (P+), under the circumstance that the implant buried layer 110C of the first conductivity type (the "PBL") is alternatively removed. It is believed that such modified embodiment may also be used for implementing the inventive effects of the present invention and significantly decreasing the resistivity of the bipolar junction transistor device.

As a result, to sum up, according to the technical contents of the present invention, the Applicants of the present invention provide a plurality of feasible embodiments in the above-mentioned paragraphs for implementing the inventive effect of the invention for your references. It is apparent that, compared to the conventional prior arts, the present invention is characterized by providing a bipolar junction transistor structure having both lateral and vertical conducting paths. As can be seen from the plurality of embodiments, it is obvious that the first pin P1 and the second pin P2 are configured and disposed on a same surface of the bipolar junction transistor structure. And thus, no backside metallization process is needed as it was required in the prior arts. As a result, it is believed that by employing the present invention, the conventional process steps, fabrication cost and process complexity can be significantly reduced.

The Applicants of the present invention have disclosed a plurality of applicable embodiments, which are advantageous of having extraordinary layout flexibility and can be composed of a variety of layout designs. Accordingly, in view of the technical contents and manners disclosed in the present invention without departing from the spirits of the present invention, it is believed that those skilled in the art and having general knowledge are able to make appropriate modifications or variations based on necessary circuit layout requirements, and the present invention is not restricted by the certain limited configurations and/or circuit diagrams as disclosed in the embodiments of the present invention. As a result, either the modifications or the variations should still fall into the scope of the present invention, and the present invention covers the modifications and its equality.

More specifically, according to the technical characteristics of the present invention which have been provided by the Applicants as illustrated in the previous paragraphs, it is obvious that the disclosed bipolar junction transistor with lateral and vertical conducting paths is effective. As can be seen from the embodiments, the present invention is aimed to propose providing the heavily doped regions having the same conductivity type in the doped layer and in the doped well region, and electrically connecting in common. The bipolar junction transistor having both lateral conducting path and vertical conducting path is formed, and a great number of merits and advantages can be accomplished by adopting the present invention. Therefore, in view of all, it is obvious that the present invention is not only novel and inventive but also believed to be advantageous of solving and avoiding the conventional issues existing in the prior arts.

As a result, when compared to the prior arts, it is ensured that the present invention apparently shows much more effective performances than before. In addition, it is believed that the present invention is instinct, effective and highly competitive for IC technology and industries in the market nowadays, whereby having extraordinary availability and competitiveness for future industrial developments and being in condition for early allowance.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:
1. A bipolar junction transistor with lateral and vertical conducting paths, comprising:
   a semiconductor substrate of a first conductivity type;
   a doped layer of the first conductivity type, which is formed on the semiconductor substrate;
   a doped well region of a second conductivity type, which is formed in the doped layer of the first conductivity type, and the second conductivity type is opposite to the first conductivity type, wherein a first heavily doped region of the second conductivity type, a second heavily doped region of the second conductivity type, a third heavily doped region of the first conductivity type, a fourth heavily doped region of the first conductivity type and a fifth heavily doped region of the first conductivity type are further disposed in the doped well region of the second conductivity type, the fifth heavily doped region of the first conductivity type is electrically coupled with a first pin, the third heavily doped region of the first conductivity type and the fourth heavily doped region of the first conductivity type are electrically connected in common and coupled with a second pin, the first heavily doped region of the second conductivity type and the second heavily doped region of the second conductivity type are spaced apart by the third heavily doped region of the first conductivity type, the fourth heavily doped region of the first con- ductivity type and the fifth heavily doped region of the first conductivity type; and a sixth heavily doped region of the first conductivity type and a seventh heavily doped region of the first conductivity type, being disposed in the doped layer of the first conductivity type, wherein the sixth heavily doped region of the first conductivity type and the seventh heavily doped region of the first conductivity type are spaced apart by the doped well region of the second conductivity type, and the sixth heavily doped region of the first conductivity type is electrically connected with the first heavily doped region of the second conductivity type, and the seventh heavily doped region of the first conductivity type is electrically connected with the second heavily doped region of the second conductivity type.

2. The bipolar junction transistor with lateral and vertical conducting paths according to claim 1, wherein when the first conductivity type is N type and the second conductivity type is P type, the first pin and the second pin are electrically coupled to a positive voltage level and a ground voltage level, respectively so as to provide a positive surged operating mode.

3. The bipolar junction transistor with lateral and vertical conducting paths according to claim 2, wherein when the positive surged operating mode is applied, the bipolar junction transistor having a lateral conducting path is formed, and the lateral conducting path comprises at least one lateral n-p-n bipolar junction transistor structure.

4. The bipolar junction transistor with lateral and vertical conducting paths according to claim 3, wherein the at least one lateral n-p-n bipolar junction transistor structure is constructed from the fifth heavily doped region of the first conductivity type, the doped well region of the second conductivity type to the third heavily doped region of the first conductivity type, and from the fifth heavily doped region of the first conductivity type, the doped well region of the second conductivity type to the fourth heavily doped region of the first conductivity type.

5. The bipolar junction transistor with lateral and vertical conducting paths according to claim 2, wherein when the positive surged operating mode is applied, the bipolar junction transistor having a vertical conducting path is formed, and the vertical conducting path comprises at least one vertical n-p-n bipolar junction transistor structure and at least one forward diode connected in series with the vertical n-p-n bipolar junction transistor structure.

6. The bipolar junction transistor with lateral and vertical conducting paths according to claim 5, wherein the at least one vertical n-p-n bipolar junction transistor structure is constructed from the fifth heavily doped region of the first conductivity type, the doped well region of the second conductivity type, the doped layer of the first conductivity type to the sixth heavily doped region of the first conductivity type, and from the fifth heavily doped region of the first conductivity type, the doped well region of the second conductivity type, the doped layer of the first conductivity type to the seventh heavily doped region of the first conductivity type.

7. The bipolar junction transistor with lateral and vertical conducting paths according to claim 5, wherein the at least one forward diode is constructed from the sixth heavily doped region of the first conductivity type, the first heavily doped region of the second conductivity type, the doped well region of the second conductivity type to the third heavily doped region of the first conductivity type, and from the seventh heavily doped region of the first conductivity type, the second heavily doped region of the second conductivity type, the doped well region of the second conductivity type to the fourth heavily doped region of the first conductivity type.

8. The bipolar junction transistor with lateral and vertical conducting paths according to claim 1, wherein when the first conductivity type is N type and the second conductivity type is P type, the first pin and the second pin are electrically coupled to a negative voltage level and a ground voltage level, respectively so as to provide a negative surged operating mode.

9. The bipolar junction transistor with lateral and vertical conducting paths according to claim 8, wherein when the negative surged operating mode is applied, the bipolar junction transistor having a lateral conducting path is formed, and the lateral conducting path comprises at least one lateral n-p-n bipolar junction transistor structure.

10. The bipolar junction transistor with lateral and vertical conducting paths according to claim 9, wherein the at least one lateral n-p-n bipolar junction transistor structure is constructed from the third heavily doped region of the first conductivity type, the doped well region of the second conductivity type to the fifth heavily doped region of the first conductivity type, and from the fourth heavily doped region of the first conductivity type, the doped well region of the second conductivity type to the fifth heavily doped region of the first conductivity type.

11. The bipolar junction transistor with lateral and vertical conducting paths according to claim 1, further comprising an eighth heavily doped region of the second conductivity type and a ninth heavily doped region of the second conductivity type, being disposed in the doped layer of the first conductivity type, wherein the eighth heavily doped region of the second conductivity type, the ninth heavily doped region of the second conductivity type, the third heavily doped region of the first conductivity type, and the fourth heavily doped region of the first conductivity type are electrically connected in common and coupled with the second pin.

12. The bipolar junction transistor with lateral and vertical conducting paths according to claim 11, wherein when the first conductivity type is N type and the second conductivity type is P type, the first pin and the second pin are electrically coupled to a positive voltage level and a ground voltage level, respectively so as to provide a positive surged operating mode.

13. The bipolar junction transistor with lateral and vertical conducting paths according to claim 12, wherein when the positive surged operating mode is applied, the bipolar junction transistor having a lateral conducting path is formed, and the lateral conducting path comprises at least one lateral n-p-n bipolar junction transistor structure.

14. The bipolar junction transistor with lateral and vertical conducting paths according to claim 13, wherein the at least one lateral n-p-n bipolar junction transistor structure is constructed from the fifth heavily doped region of the first conductivity type, the doped well region of the second conductivity type to the third heavily doped region of the first conductivity type, and from the fifth heavily doped region of the first conductivity type, the doped well region of the second conductivity type to the fourth heavily doped region of the first conductivity type.

15. The bipolar junction transistor with lateral and vertical conducting paths according to claim 12, wherein when the positive surged operating mode is applied, the bipolar junction transistor having a vertical conducting path is formed, and the vertical conducting path comprises at least one vertical n-p-n bipolar junction transistor structure and at least one forward diode connected in series with the vertical n-p-n bipolar junction transistor structure.

16. The bipolar junction transistor with lateral and vertical conducting paths according to claim 15, wherein the at least one vertical n-p-n bipolar junction transistor structure is constructed from the fifth heavily doped region of the first conductivity type, the doped well region of the second conductivity type, the doped layer of the first conductivity type to the sixth heavily doped region of the first conductivity type, and from the fifth heavily doped region of the first conductivity type, the doped well region of the second conductivity type, the doped layer of the first conductivity type to the seventh heavily doped region of the first conductivity type.

17. The bipolar junction transistor with lateral and vertical conducting paths according to claim 15, wherein the at least one forward diode is constructed from the sixth heavily doped region of the first conductivity type, the first heavily doped region of the second conductivity type, the doped well region of the second conductivity type to the third heavily doped region of the first conductivity type, and from the seventh heavily doped region of the first conductivity type, the second heavily doped region of the second conductivity type, the doped well region of the second conductivity type to the fourth heavily doped region of the first conductivity type.

18. The bipolar junction transistor with lateral and vertical conducting paths according to claim 11, wherein when the first conductivity type is N type and the second conductivity type is P type, the first pin and the second pin are electrically coupled to a negative voltage level and a ground voltage level, respectively so as to provide a negative surged operating mode.

19. The bipolar junction transistor with lateral and vertical conducting paths according to claim 18, wherein when the negative surged operating mode is applied, the bipolar junction transistor having a lateral conducting path is formed, and the lateral conducting path comprises at least one lateral n-p-n bipolar junction transistor structure.

20. The bipolar junction transistor with lateral and vertical conducting paths according to claim 19, wherein the at least one lateral n-p-n bipolar junction transistor structure is constructed from the third heavily doped region of the first conductivity type, the doped well region of the second conductivity type to the fifth heavily doped region of the first conductivity type, and from the fourth heavily doped region of the first conductivity type, the doped well region of the second conductivity type to the fifth heavily doped region of the first conductivity type.

21. The bipolar junction transistor with lateral and vertical conducting paths according to claim 18, wherein when the negative surged operating mode is applied, the bipolar junction transistor having a vertical conducting path is formed, and the vertical conducting path comprises at least one diode-like Silicon Controlled Rectifier (SCR) structure which are parallelly connected with two diodes in series.

22. The bipolar junction transistor with lateral and vertical conducting paths according to claim 21, wherein the at least one diode-like Silicon Controlled Rectifier (SCR) structure is constructed from the eighth heavily doped region of the second conductivity type, the doped layer of the first conductivity type, the doped well region of the second conductivity type, to the fifth heavily doped region of the first conductivity type, and from the ninth heavily doped region of the second conductivity type, the doped layer of the first conductivity type, the doped well region of the second conductivity type, to the fifth heavily doped region of the first conductivity type.

23. The bipolar junction transistor with lateral and vertical conducting paths according to claim 1, wherein w % ben the first conductivity type is P type, the second conductivity type is N type, and the first pin is electrically coupled to a low voltage level, and the second pin is electrically coupled to a high voltage level which is greater than the low voltage level of the first pin.

24. The bipolar junction transistor with lateral and vertical conducting paths according to claim 1, further comprising an implant buried layer of the first conductivity type, which is disposed on the semiconductor substrate of the first conductivity type and underneath the doped layer of the first conductivity type.

25. The bipolar junction transistor with lateral and vertical conducting paths according to claim 1, further comprising a first well region of the first conductivity type and a second well region of the first conductivity type, wherein the first well region of the first conductivity type and the second well region of the first conductivity type are disposed in the doped layer of the first conductivity type, such that the sixth heavily doped region of the first conductivity type is disposed in the first well region of the first conductivity type, and the seventh heavily doped region of the first conductivity type is disposed in the second well region of the first conductivity type.

26. The bipolar junction transistor with lateral and vertical conducting paths according to claim 24, further comprising a first well region of the first conductivity type and a second well region of the first conductivity type, wherein the first well region of the first conductivity type and the second well region of the first conductivity type are disposed in the doped layer of the first conductivity type, such that the sixth heavily doped region of the first conductivity type is disposed in the first well region of the first conductivity type, and the seventh heavily doped region of the first conductivity type is disposed in the second well region of the first conductivity type.

27. The bipolar junction transistor with lateral and vertical conducting paths according to claim 1, wherein the first pin and the second pin are disposed on a same surface of the bipolar junction transistor with lateral and vertical conducting paths.

* * * * *